(12) United States Patent
Purayath et al.

(10) Patent No.: US 9,165,786 B1
(45) Date of Patent: Oct. 20, 2015

(54) INTEGRATED OXIDE AND NITRIDE RECESS FOR BETTER CHANNEL CONTACT IN 3D ARCHITECTURES

(71) Applicant: Applied Materials, Inc., Santa Clara, CA (US)

(72) Inventors: Vinod R. Purayath, Los Gatos, CA (US); Randhir Thakur, Fremont, CA (US); Nitin K. Ingle, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/452,220

(22) Filed: Aug. 5, 2014

(51) Int. Cl.
  *H01L 21/311* (2006.01)
  *H01L 29/66* (2006.01)
  *H01L 21/67* (2006.01)

(52) U.S. Cl.
  CPC .... *H01L 21/31116* (2013.01); *H01L 21/67207* (2013.01); *H01L 29/66833* (2013.01)

(58) Field of Classification Search
  None
  See application file for complete search history.

(56) References Cited

U.S. PATENT DOCUMENTS

| | | |
|---|---|---|
| 2,369,620 A | 2/1945 | Sullivan et al. |
| 3,451,840 A | 6/1969 | Hough |
| 3,937,857 A | 2/1976 | Brummett et al. |
| 4,006,047 A | 2/1977 | Brummett et al. |
| 4,209,357 A | 6/1980 | Gorin et al. |
| 4,214,946 A | 7/1980 | Forget et al. |
| 4,232,060 A | 11/1980 | Mallory, Jr. |
| 4,234,628 A | 11/1980 | DuRose |
| 4,265,943 A | 5/1981 | Goldstein et al. |
| 4,364,803 A | 12/1982 | Nidola et al. |
| 4,368,223 A | 1/1983 | Kobayashi et al. |
| 4,397,812 A | 8/1983 | Mallory, Jr. |
| 4,468,413 A | 8/1984 | Bachmann |
| 4,565,601 A | 1/1986 | Kakehi et al. |
| 4,571,819 A | 2/1986 | Rogers et al. |
| 4,579,618 A | 4/1986 | Celestino et al. |
| 4,585,920 A | 4/1986 | Hoog et al. |
| 4,625,678 A | 12/1986 | Shioya et al. |

(Continued)

FOREIGN PATENT DOCUMENTS

| | | |
|---|---|---|
| CN | 1375575 | 10/2002 |
| CN | 1412861 A | 4/2003 |

(Continued)

OTHER PUBLICATIONS

Abe et al., "Developments of plasma etching technology for fabricating semiconductor devices," Jpn. J. Appl. Phys., vol. 47, No. 3R, Mar. 2008, 21 pgs.

(Continued)

*Primary Examiner* — Allan Olsen
(74) *Attorney, Agent, or Firm* — Kilpatrick Townsend & Stockton LLP

(57) ABSTRACT

Methods of etching back an oxide-nitride-oxide (ONO) layer of a 3-d flash memory cell without breaking vacuum are described. The methods include recessing the two outer silicon oxide dielectric layers to expose the flanks of the thin silicon nitride layer. The silicon nitride layer is then etched back from all exposed sides to hasten the process on the same substrate processing mainframe. Both etching back the silicon oxide and etching back the silicon nitride use remotely excited fluorine-containing apparatuses attached to the same mainframe to facilitate performing both operations without an intervening atmospheric exposure. The process may also be reversed such that the silicon nitride is etched back first.

15 Claims, 8 Drawing Sheets

(56) References Cited

U.S. PATENT DOCUMENTS

| | | |
|---|---|---|
| 4,632,857 A | 12/1986 | Mallory, Jr. |
| 4,656,052 A | 4/1987 | Satou et al. |
| 4,690,746 A | 9/1987 | McInerney et al. |
| 4,714,520 A | 12/1987 | Gwozdz |
| 4,715,937 A | 12/1987 | Moslehi et al. |
| 4,749,440 A | 6/1988 | Blackwood et al. |
| 4,753,898 A | 6/1988 | Parrillo et al. |
| 4,786,360 A | 11/1988 | Cote et al. |
| 4,793,897 A | 12/1988 | Dunfield et al. |
| 4,807,016 A | 2/1989 | Douglas |
| 4,810,520 A | 3/1989 | Wu |
| 4,816,638 A | 3/1989 | Ukai et al. |
| 4,820,377 A | 4/1989 | Davis et al. |
| 4,851,370 A | 7/1989 | Doklan et al. |
| 4,865,685 A | 9/1989 | Palmour |
| 4,872,947 A | 10/1989 | Wang et al. |
| 4,878,994 A | 11/1989 | Jucha et al. |
| 4,886,570 A | 12/1989 | Davis et al. |
| 4,892,753 A | 1/1990 | Wang et al. |
| 4,894,352 A | 1/1990 | Lane et al. |
| 4,904,341 A | 2/1990 | Blaugher et al. |
| 4,904,621 A | 2/1990 | Loewenstein et al. |
| 4,913,929 A | 4/1990 | Moslehi et al. |
| 4,951,601 A | 8/1990 | Maydan et al. |
| 4,960,488 A | 10/1990 | Law et al. |
| 4,980,018 A | 12/1990 | Mu et al. |
| 4,981,551 A | 1/1991 | Palmour |
| 4,985,372 A | 1/1991 | Narita |
| 4,992,136 A | 2/1991 | Tachi et al. |
| 4,994,404 A | 2/1991 | Sheng et al. |
| 5,000,113 A | 3/1991 | Wang et al. |
| 5,013,691 A | 5/1991 | Lory et al. |
| 5,030,319 A | 7/1991 | Nishino et al. |
| 5,061,838 A | 10/1991 | Lane et al. |
| 5,089,441 A | 2/1992 | Moslehi |
| 5,089,442 A | 2/1992 | Olmer |
| 5,147,692 A | 9/1992 | Bengston |
| 5,156,881 A | 10/1992 | Okano et al. |
| 5,186,718 A | 2/1993 | Tepman et al. |
| 5,198,034 A | 3/1993 | deBoer et al. |
| 5,203,911 A | 4/1993 | Sricharoenchaikit et al. |
| 5,215,787 A | 6/1993 | Homma |
| 5,228,501 A | 7/1993 | Tepman et al. |
| 5,231,690 A | 7/1993 | Soma et al. |
| 5,235,139 A | 8/1993 | Bengston et al. |
| 5,238,499 A | 8/1993 | van de Ven et al. |
| 5,240,497 A | 8/1993 | Shacham et al. |
| 5,248,527 A | 9/1993 | Uchida et al. |
| 5,252,178 A | 10/1993 | Moslehi |
| 5,266,157 A | 11/1993 | Kadomura |
| 5,270,125 A | 12/1993 | America et al. |
| 5,271,972 A | 12/1993 | Kwok et al. |
| 5,275,977 A | 1/1994 | Otsubo et al. |
| 5,279,865 A | 1/1994 | Chebi et al. |
| 5,288,518 A | 2/1994 | Homma |
| 5,290,382 A | 3/1994 | Zarowin et al. |
| 5,300,463 A | 4/1994 | Cathey et al. |
| 5,302,233 A | 4/1994 | Kim et al. |
| 5,306,530 A | 4/1994 | Strongin et al. |
| 5,314,724 A | 5/1994 | Tsukune et al. |
| 5,316,804 A | 5/1994 | Tomikawa et al. |
| 5,319,247 A | 6/1994 | Matsuura |
| 5,326,427 A | 7/1994 | Jerbic |
| 5,328,558 A | 7/1994 | Kawamura et al. |
| 5,328,810 A | 7/1994 | Lowrey et al. |
| 5,334,552 A | 8/1994 | Homma |
| 5,345,999 A | 9/1994 | Hosokawa |
| 5,352,636 A | 10/1994 | Beinglass |
| 5,356,478 A | 10/1994 | Chen et al. |
| 5,362,526 A | 11/1994 | Wang et al. |
| 5,368,897 A | 11/1994 | Kurihara et al. |
| 5,380,560 A | 1/1995 | Kaja et al. |
| 5,382,311 A | 1/1995 | Ishikawa et al. |
| 5,384,284 A | 1/1995 | Doan et al. |
| 5,385,763 A | 1/1995 | Okano et al. |
| 5,399,237 A | 3/1995 | Keswick et al. |
| 5,399,529 A | 3/1995 | Homma |
| 5,403,434 A | 4/1995 | Moslehi |
| 5,413,967 A | 5/1995 | Matsuda et al. |
| 5,415,890 A | 5/1995 | Kloiber et al. |
| 5,416,048 A | 5/1995 | Blalock et al. |
| 5,420,075 A | 5/1995 | Homma et al. |
| 5,429,995 A | 7/1995 | Nishiyama et al. |
| 5,439,553 A | 8/1995 | Grant et al. |
| 5,451,259 A | 9/1995 | Krogh |
| 5,468,342 A | 11/1995 | Nulty et al. |
| 5,474,589 A | 12/1995 | Ohga et al. |
| 5,478,403 A | 12/1995 | Shinagawa et al. |
| 5,478,462 A | 12/1995 | Walsh |
| 5,483,920 A | 1/1996 | Pryor |
| 5,500,249 A | 3/1996 | Telford et al. |
| 5,505,816 A | 4/1996 | Barnes et al. |
| 5,510,216 A | 4/1996 | Calabrese et al. |
| 5,516,367 A | 5/1996 | Lei et al. |
| 5,531,835 A | 7/1996 | Fodor et al. |
| 5,534,070 A | 7/1996 | Okamura et al. |
| 5,536,360 A | 7/1996 | Nguyen et al. |
| 5,549,780 A | 8/1996 | Koinuma et al. |
| 5,558,717 A | 9/1996 | Zhao et al. |
| 5,560,779 A | 10/1996 | Knowles et al. |
| 5,563,105 A | 10/1996 | Dobuzinsky et al. |
| 5,571,576 A | 11/1996 | Qian et al. |
| 5,578,130 A | 11/1996 | Hayashi et al. |
| 5,578,161 A | 11/1996 | Auda |
| 5,580,421 A | 12/1996 | Hiatt et al. |
| 5,591,269 A | 1/1997 | Arami et al. |
| 5,599,740 A | 2/1997 | Jang et al. |
| 5,624,582 A | 4/1997 | Cain |
| 5,626,922 A | 5/1997 | Miyanaga et al. |
| 5,635,086 A | 6/1997 | Warren, Jr. |
| 5,645,645 A | 7/1997 | Zhang et al. |
| 5,648,125 A | 7/1997 | Cane |
| 5,648,175 A | 7/1997 | Russell et al. |
| 5,656,093 A | 8/1997 | Burkhart et al. |
| 5,661,093 A | 8/1997 | Ravi et al. |
| 5,674,787 A | 10/1997 | Zhao et al. |
| 5,679,606 A | 10/1997 | Wang et al. |
| 5,688,331 A | 11/1997 | Aruga et al. |
| 5,695,810 A | 12/1997 | Dubin et al. |
| 5,712,185 A | 1/1998 | Tsai et al. |
| 5,716,500 A | 2/1998 | Bardos et al. |
| 5,716,506 A | 2/1998 | Maclay et al. |
| 5,719,085 A | 2/1998 | Moon et al. |
| 5,733,816 A | 3/1998 | Iyer et al. |
| 5,747,373 A | 5/1998 | Yu |
| 5,755,859 A | 5/1998 | Brusic et al. |
| 5,756,400 A | 5/1998 | Ye et al. |
| 5,756,402 A | 5/1998 | Jimbo et al. |
| 5,772,770 A | 6/1998 | Suda et al. |
| 5,781,693 A | 7/1998 | Ballance et al. |
| 5,786,276 A | 7/1998 | Brooks et al. |
| 5,789,300 A | 8/1998 | Fulford |
| 5,800,686 A | 9/1998 | Littau et al. |
| 5,804,259 A | 9/1998 | Robles |
| 5,812,403 A | 9/1998 | Fong et al. |
| 5,820,723 A | 10/1998 | Benjamin et al. |
| 5,824,599 A | 10/1998 | Schacham-Diamand et al. |
| 5,830,805 A | 11/1998 | Schacham-Diamand et al. |
| 5,838,055 A | 11/1998 | Kleinhenz et al. |
| 5,843,538 A | 12/1998 | Ehrsam et al. |
| 5,844,195 A | 12/1998 | Fairbairn et al. |
| 5,846,332 A | 12/1998 | Zhao et al. |
| 5,846,375 A | 12/1998 | Gilchrist et al. |
| 5,846,598 A | 12/1998 | Semkow et al. |
| 5,849,639 A | 12/1998 | Molloy et al. |
| 5,850,105 A | 12/1998 | Dawson et al. |
| 5,855,681 A | 1/1999 | Maydan et al. |
| 5,856,240 A | 1/1999 | Sinha et al. |
| 5,858,876 A | 1/1999 | Chew |
| 5,872,052 A | 2/1999 | Iyer |
| 5,872,058 A | 2/1999 | Van Cleemput et al. |
| 5,882,424 A | 3/1999 | Taylor et al. |
| 5,882,786 A | 3/1999 | Nassau et al. |
| 5,885,404 A | 3/1999 | Kim et al. |

(56) References Cited

U.S. PATENT DOCUMENTS

| | | |
|---|---|---|
| 5,885,749 A | 3/1999 | Huggins et al. |
| 5,888,906 A | 3/1999 | Sandhu et al. |
| 5,891,349 A | 4/1999 | Tobe et al. |
| 5,891,513 A | 4/1999 | Dubin et al. |
| 5,897,751 A | 4/1999 | Makowiecki |
| 5,899,752 A | 5/1999 | Hey et al. |
| 5,904,827 A | 5/1999 | Reynolds |
| 5,907,790 A | 5/1999 | Kellam |
| 5,910,340 A | 6/1999 | Uchida et al. |
| 5,913,140 A | 6/1999 | Roche et al. |
| 5,913,147 A | 6/1999 | Dubin et al. |
| 5,915,190 A | 6/1999 | Pirkle |
| 5,918,116 A | 6/1999 | Chittipeddi |
| 5,920,792 A | 7/1999 | Lin |
| 5,932,077 A | 8/1999 | Reynolds |
| 5,933,757 A | 8/1999 | Yoshikawa et al. |
| 5,935,334 A | 8/1999 | Fong et al. |
| 5,937,323 A | 8/1999 | Orczyk et al. |
| 5,939,831 A | 8/1999 | Fong et al. |
| 5,942,075 A | 8/1999 | Nagahata et al. |
| 5,944,902 A | 8/1999 | Redeker et al. |
| 5,951,601 A | 9/1999 | Lesinski et al. |
| 5,951,776 A | 9/1999 | Selyutin et al. |
| 5,953,591 A | 9/1999 | Ishihara et al. |
| 5,953,635 A | 9/1999 | Andideh |
| 5,968,610 A | 10/1999 | Liu et al. |
| 5,969,422 A | 10/1999 | Ting et al. |
| 5,976,327 A | 11/1999 | Tanaka |
| 5,990,000 A | 11/1999 | Hong et al. |
| 5,990,013 A | 11/1999 | Berenguer et al. |
| 5,993,916 A | 11/1999 | Zhao et al. |
| 6,004,884 A | 12/1999 | Abraham |
| 6,010,962 A | 1/2000 | Liu et al. |
| 6,013,191 A | 1/2000 | Nasser-Faili et al. |
| 6,013,584 A | 1/2000 | M'Saad |
| 6,015,724 A | 1/2000 | Yamazaki et al. |
| 6,015,747 A | 1/2000 | Lopatin et al. |
| 6,020,271 A | 2/2000 | Yanagida |
| 6,030,666 A | 2/2000 | Lam et al. |
| 6,030,881 A | 2/2000 | Papasouliotis et al. |
| 6,035,101 A | 3/2000 | Sajoto et al. |
| 6,037,018 A | 3/2000 | Jang et al. |
| 6,037,266 A | 3/2000 | Tao et al. |
| 6,039,851 A | 3/2000 | Iyer |
| 6,053,982 A | 4/2000 | Halpin et al. |
| 6,059,643 A | 5/2000 | Hu et al. |
| 6,063,683 A | 5/2000 | Wu et al. |
| 6,063,712 A | 5/2000 | Gilton et al. |
| 6,065,424 A | 5/2000 | Shacham-Diamand et al. |
| 6,072,227 A | 6/2000 | Yau et al. |
| 6,077,780 A | 6/2000 | Dubin |
| 6,080,529 A | 6/2000 | Ye et al. |
| 6,083,344 A | 7/2000 | Hanawa et al. |
| 6,083,844 A | 7/2000 | Bui-Le et al. |
| 6,086,677 A | 7/2000 | Umotoy et al. |
| 6,087,278 A | 7/2000 | Kim et al. |
| 6,093,594 A | 7/2000 | Yeap et al. |
| 6,099,697 A | 8/2000 | Hausmann |
| 6,107,199 A | 8/2000 | Allen et al. |
| 6,110,530 A | 8/2000 | Chen et al. |
| 6,110,836 A | 8/2000 | Cohen et al. |
| 6,110,838 A | 8/2000 | Loewenstein |
| 6,113,771 A | 9/2000 | Landau et al. |
| 6,117,245 A | 9/2000 | Mandrekar et al. |
| 6,136,163 A | 10/2000 | Cheung et al. |
| 6,136,685 A | 10/2000 | Narwankar et al. |
| 6,136,693 A | 10/2000 | Chan et al. |
| 6,140,234 A | 10/2000 | Uzoh et al. |
| 6,144,099 A | 11/2000 | Lopatin et al. |
| 6,147,009 A | 11/2000 | Grill et al. |
| 6,149,828 A | 11/2000 | Vaartstra |
| 6,150,628 A | 11/2000 | Smith et al. |
| 6,153,935 A | 11/2000 | Edelstein et al. |
| 6,165,912 A | 12/2000 | McConnell et al. |
| 6,167,834 B1 | 1/2001 | Wang et al. |
| 6,169,021 B1 | 1/2001 | Akram et al. |
| 6,170,428 B1 | 1/2001 | Redeker et al. |
| 6,171,661 B1 | 1/2001 | Zheng et al. |
| 6,174,812 B1 | 1/2001 | Hsiung et al. |
| 6,176,198 B1 | 1/2001 | Kao et al. |
| 6,177,245 B1 | 1/2001 | Ward et al. |
| 6,179,924 B1 | 1/2001 | Zhao et al. |
| 6,180,523 B1 | 1/2001 | Lee et al. |
| 6,182,602 B1 | 2/2001 | Redeker et al. |
| 6,189,483 B1 | 2/2001 | Ishikawa et al. |
| 6,190,233 B1 | 2/2001 | Hong et al. |
| 6,191,026 B1 | 2/2001 | Rana et al. |
| 6,194,038 B1 | 2/2001 | Rossman |
| 6,197,181 B1 | 3/2001 | Chen |
| 6,197,364 B1 | 3/2001 | Paunovic et al. |
| 6,197,680 B1 | 3/2001 | Lin et al. |
| 6,197,688 B1 | 3/2001 | Simpson |
| 6,197,705 B1 | 3/2001 | Vassiliev |
| 6,203,863 B1 | 3/2001 | Liu et al. |
| 6,204,200 B1 | 3/2001 | Shieh et al. |
| 6,217,658 B1 | 4/2001 | Orczyk et al. |
| 6,228,233 B1 | 5/2001 | Lakshmikanthan et al. |
| 6,228,751 B1 | 5/2001 | Yamazaki et al. |
| 6,228,758 B1 | 5/2001 | Pellerin et al. |
| 6,235,643 B1 | 5/2001 | Mui et al. |
| 6,238,513 B1 | 5/2001 | Arnold et al. |
| 6,238,582 B1 | 5/2001 | Williams et al. |
| 6,241,845 B1 | 6/2001 | Gadgil et al. |
| 6,242,349 B1 | 6/2001 | Nogami et al. |
| 6,245,396 B1 | 6/2001 | Nogami |
| 6,245,670 B1 | 6/2001 | Cheung et al. |
| 6,251,236 B1 | 6/2001 | Stevens |
| 6,251,802 B1 | 6/2001 | Moore et al. |
| 6,258,220 B1 | 7/2001 | Dordi et al. |
| 6,258,223 B1 | 7/2001 | Cheung et al. |
| 6,258,270 B1 | 7/2001 | Hilgendorff et al. |
| 6,261,637 B1 | 7/2001 | Oberle |
| 6,277,733 B1 | 8/2001 | Smith |
| 6,277,752 B1 | 8/2001 | Chen |
| 6,277,763 B1 | 8/2001 | Kugimiya et al. |
| 6,281,135 B1 | 8/2001 | Han et al. |
| 6,291,282 B1 | 9/2001 | Wilk et al. |
| 6,291,348 B1 | 9/2001 | Lopatin et al. |
| 6,303,418 B1 | 10/2001 | Cha et al. |
| 6,312,995 B1 | 11/2001 | Yu |
| 6,313,035 B1 | 11/2001 | Sandhu et al. |
| 6,319,387 B1 | 11/2001 | Krishnamoorthy et al. |
| 6,323,128 B1 | 11/2001 | Sambucetti et al. |
| 6,335,261 B1 | 1/2002 | Natzle et al. |
| 6,335,288 B1 | 1/2002 | Kwan et al. |
| 6,340,435 B1 | 1/2002 | Bjorkman et al. |
| 6,342,733 B1 | 1/2002 | Hu et al. |
| 6,344,410 B1 | 2/2002 | Lopatin et al. |
| 6,350,320 B1 | 2/2002 | Sherstinsky et al. |
| 6,351,013 B1 | 2/2002 | Luning et al. |
| 6,352,081 B1 | 3/2002 | Lu et al. |
| 6,364,949 B1 | 4/2002 | Or et al. |
| 6,364,954 B2 | 4/2002 | Umotoy et al. |
| 6,364,957 B1 | 4/2002 | Schneider et al. |
| 6,372,657 B1 | 4/2002 | Hineman et al. |
| 6,375,748 B1 | 4/2002 | Yudovsky et al. |
| 6,379,575 B1 | 4/2002 | Yin et al. |
| 6,383,951 B1 | 5/2002 | Li |
| 6,387,207 B1 | 5/2002 | Janakiraman et al. |
| 6,391,753 B1 | 5/2002 | Yu |
| 6,395,150 B1 | 5/2002 | Van Cleemput et al. |
| 6,403,491 B1 | 6/2002 | Liu et al. |
| 6,416,647 B1 | 7/2002 | Dordi et al. |
| 6,427,623 B2 | 8/2002 | Ko |
| 6,432,819 B1 | 8/2002 | Pavate et al. |
| 6,436,816 B1 | 8/2002 | Lee et al. |
| 6,440,863 B1 | 8/2002 | Tsai et al. |
| 6,441,492 B1 | 8/2002 | Cunningham |
| 6,446,572 B1 | 9/2002 | Brcka |
| 6,448,537 B1 | 9/2002 | Nering |
| 6,458,718 B1 | 10/2002 | Todd |
| 6,461,974 B1 | 10/2002 | Ni et al. |
| 6,462,371 B1 | 10/2002 | Weimer et al. |
| 6,465,366 B1 | 10/2002 | Nemani et al. |

(56) References Cited

U.S. PATENT DOCUMENTS

| | | |
|---|---|---|
| 6,477,980 B1 | 11/2002 | White et al. |
| 6,479,373 B2 | 11/2002 | Dreybrodt et al. |
| 6,488,984 B1 | 12/2002 | Wada et al. |
| 6,494,959 B1 | 12/2002 | Samoilov et al. |
| 6,499,425 B1 | 12/2002 | Sandhu et al. |
| 6,500,728 B1 | 12/2002 | Wang |
| 6,503,843 B1 | 1/2003 | Xia et al. |
| 6,506,291 B2 | 1/2003 | Tsai et al. |
| 6,516,815 B1 | 2/2003 | Stevens et al. |
| 6,518,548 B2 | 2/2003 | Sugaya et al. |
| 6,527,968 B1 | 3/2003 | Wang et al. |
| 6,528,409 B1 | 3/2003 | Lopatin et al. |
| 6,531,377 B2 | 3/2003 | Knorr et al. |
| 6,537,733 B2 | 3/2003 | Campana et al. |
| 6,541,397 B1 | 4/2003 | Bencher |
| 6,541,671 B1 | 4/2003 | Martinez et al. |
| 6,544,340 B2 | 4/2003 | Yudovsky |
| 6,547,977 B1 | 4/2003 | Yan et al. |
| 6,551,924 B1 | 4/2003 | Dalton et al. |
| 6,565,729 B2 | 5/2003 | Chen et al. |
| 6,569,773 B1 | 5/2003 | Gellrich et al. |
| 6,573,030 B1 | 6/2003 | Fairbairn et al. |
| 6,573,606 B2 | 6/2003 | Sambucetti et al. |
| 6,586,163 B1 | 7/2003 | Okabe et al. |
| 6,596,602 B2 | 7/2003 | Iizuka et al. |
| 6,596,654 B1 | 7/2003 | Bayman et al. |
| 6,602,434 B1 | 8/2003 | Hung et al. |
| 6,603,269 B1 | 8/2003 | Vo et al. |
| 6,605,874 B2 | 8/2003 | Leu et al. |
| 6,616,967 B1 | 9/2003 | Test |
| 6,627,532 B1 | 9/2003 | Gaillard et al. |
| 6,635,578 B1 | 10/2003 | Xu et al. |
| 6,638,810 B2 | 10/2003 | Bakli et al. |
| 6,645,301 B2 | 11/2003 | Sainty |
| 6,645,550 B1 | 11/2003 | Cheung et al. |
| 6,656,831 B1 | 12/2003 | Lee et al. |
| 6,656,837 B2 | 12/2003 | Xu et al. |
| 6,663,715 B1 | 12/2003 | Yuda et al. |
| 6,677,242 B1 | 1/2004 | Liu et al. |
| 6,677,247 B2 | 1/2004 | Yuan et al. |
| 6,679,981 B1 | 1/2004 | Pan et al. |
| 6,717,189 B2 | 4/2004 | Inoue et al. |
| 6,720,213 B1 | 4/2004 | Gambino et al. |
| 6,740,585 B2 | 5/2004 | Yoon et al. |
| 6,743,473 B1 | 6/2004 | Parkhe et al. |
| 6,743,732 B1 | 6/2004 | Lin et al. |
| 6,756,235 B1 | 6/2004 | Liu et al. |
| 6,759,261 B2 | 7/2004 | Shimokohbe et al. |
| 6,762,127 B2 | 7/2004 | Boiteux et al. |
| 6,762,435 B2 | 7/2004 | Towle |
| 6,764,958 B1 | 7/2004 | Nemani et al. |
| 6,765,273 B1 | 7/2004 | Chau et al. |
| 6,772,827 B2 | 8/2004 | Keller et al. |
| 6,794,290 B1 | 9/2004 | Papasouliotis et al. |
| 6,794,311 B2 | 9/2004 | Huang et al. |
| 6,796,314 B1 | 9/2004 | Graff et al. |
| 6,797,189 B2 | 9/2004 | Hung et al. |
| 6,800,830 B2 | 10/2004 | Mahawili |
| 6,802,944 B2 | 10/2004 | Ahmad et al. |
| 6,808,564 B2 | 10/2004 | Dietze |
| 6,808,748 B2 | 10/2004 | Kapoor et al. |
| 6,821,571 B2 | 11/2004 | Huang |
| 6,823,589 B2 | 11/2004 | White et al. |
| 6,830,624 B2 | 12/2004 | Janakiraman et al. |
| 6,835,995 B2 | 12/2004 | Li |
| 6,846,745 B1 | 1/2005 | Papasouliotis et al. |
| 6,852,550 B2 | 2/2005 | Tuttle et al. |
| 6,858,153 B2 | 2/2005 | Bjorkman et al. |
| 6,867,141 B2 | 3/2005 | Jung et al. |
| 6,869,880 B2 | 3/2005 | Krishnaraj et al. |
| 6,878,206 B2 | 4/2005 | Tzu et al. |
| 6,879,981 B2 | 4/2005 | Rothschild et al. |
| 6,886,491 B2 | 5/2005 | Kim et al. |
| 6,892,669 B2 | 5/2005 | Xu et al. |
| 6,893,967 B1 | 5/2005 | Wright et al. |
| 6,897,532 B1 | 5/2005 | Schwarz et al. |
| 6,903,031 B2 | 6/2005 | Karim et al. |
| 6,903,511 B2 | 6/2005 | Chistyakov |
| 6,908,862 B2 | 6/2005 | Li et al. |
| 6,911,112 B2 | 6/2005 | An |
| 6,911,401 B2 | 6/2005 | Khandan et al. |
| 6,921,556 B2 | 7/2005 | Shimizu et al. |
| 6,924,191 B2 | 8/2005 | Liu et al. |
| 6,942,753 B2 | 9/2005 | Choi et al. |
| 6,951,821 B2 | 10/2005 | Hamelin et al. |
| 6,958,175 B2 | 10/2005 | Sakamoto et al. |
| 6,958,286 B2 | 10/2005 | Chen et al. |
| 6,974,780 B2 | 12/2005 | Schuegraf |
| 7,017,269 B2 | 3/2006 | White et al. |
| 7,018,941 B2 | 3/2006 | Cui et al. |
| 7,030,034 B2 | 4/2006 | Fucsko et al. |
| 7,049,200 B2 | 5/2006 | Arghavani et al. |
| 7,078,312 B1 | 7/2006 | Sutanto et al. |
| 7,081,414 B2 | 7/2006 | Zhang et al. |
| 7,084,070 B1 | 8/2006 | Lee et al. |
| 7,115,525 B2 | 10/2006 | Abatchev et al. |
| 7,122,949 B2 | 10/2006 | Strikovski |
| 7,148,155 B1 | 12/2006 | Tarafdar et al. |
| 7,166,233 B2 | 1/2007 | Johnson et al. |
| 7,183,214 B2 | 2/2007 | Nam et al. |
| 7,196,342 B2 | 3/2007 | Ershov et al. |
| 7,205,240 B2 | 4/2007 | Karim et al. |
| 7,223,701 B2 | 5/2007 | Min et al. |
| 7,226,805 B2 | 6/2007 | Hallin et al. |
| 7,235,137 B2 | 6/2007 | Kitayama et al. |
| 7,253,123 B2 | 8/2007 | Arghavani et al. |
| 7,256,370 B2 | 8/2007 | Guiver |
| 7,288,482 B2 | 10/2007 | Panda et al. |
| 7,341,633 B2 | 3/2008 | Lubomirsky et al. |
| 7,365,016 B2 | 4/2008 | Ouellet et al. |
| 7,390,710 B2 | 6/2008 | Derderian et al. |
| 7,396,480 B2 | 7/2008 | Kao et al. |
| 7,416,989 B1 | 8/2008 | Liu et al. |
| 7,465,358 B2 | 12/2008 | Weidman et al. |
| 7,484,473 B2 | 2/2009 | Keller et al. |
| 7,488,688 B2 | 2/2009 | Chung et al. |
| 7,494,545 B2 | 2/2009 | Lam et al. |
| 7,575,007 B2 | 8/2009 | Tang et al. |
| 7,581,511 B2 | 9/2009 | Mardian et al. |
| 7,628,897 B2 | 12/2009 | Mungekar et al. |
| 7,709,396 B2 | 5/2010 | Bencher et al. |
| 7,722,925 B2 | 5/2010 | White et al. |
| 7,785,672 B2 | 8/2010 | Choi et al. |
| 7,807,578 B2 | 10/2010 | Bencher et al. |
| 7,871,926 B2 | 1/2011 | Xia et al. |
| 7,910,491 B2 | 3/2011 | Soo Kwon et al. |
| 7,915,139 B1 | 3/2011 | Lang et al. |
| 7,939,422 B2 | 5/2011 | Ingle et al. |
| 7,968,441 B2 | 6/2011 | Xu |
| 7,981,806 B2 | 7/2011 | Jung |
| 8,008,166 B2 | 8/2011 | Sanchez et al. |
| 8,058,179 B1 | 11/2011 | Draeger et al. |
| 8,071,482 B2 | 12/2011 | Kawada |
| 8,074,599 B2 | 12/2011 | Choi et al. |
| 8,083,853 B2 | 12/2011 | Choi et al. |
| 8,133,349 B1 | 3/2012 | Panagopoulos |
| 8,187,486 B1 | 5/2012 | Liu et al. |
| 8,211,808 B2 | 7/2012 | Sapre et al. |
| 8,309,440 B2 | 11/2012 | Sanchez et al. |
| 8,328,939 B2 | 12/2012 | Choi et al. |
| 8,435,902 B2 | 5/2013 | Tang et al. |
| 8,491,805 B2 | 7/2013 | Kushibiki et al. |
| 8,642,481 B2 | 2/2014 | Wang et al. |
| 8,772,888 B2 | 7/2014 | Jung et al. |
| 8,956,980 B1 | 2/2015 | Chen et al. |
| 2001/0008803 A1 | 7/2001 | Takamatsu et al. |
| 2001/0015261 A1 | 8/2001 | Kobayashi et al. |
| 2001/0028922 A1 | 10/2001 | Sandhu |
| 2001/0030366 A1 | 10/2001 | Nakano et al. |
| 2001/0034121 A1 | 10/2001 | Fu et al. |
| 2001/0041444 A1 | 11/2001 | Shields et al. |
| 2001/0053585 A1 | 12/2001 | Kikuchi et al. |
| 2001/0054381 A1 | 12/2001 | Umotoy et al. |
| 2001/0055842 A1 | 12/2001 | Uh et al. |

(56) References Cited

U.S. PATENT DOCUMENTS

| | | |
|---|---|---|
| 2002/0000202 A1 | 1/2002 | Yuda et al. |
| 2002/0011210 A1 | 1/2002 | Satoh et al. |
| 2002/0016080 A1 | 2/2002 | Khan et al. |
| 2002/0016085 A1 | 2/2002 | Huang et al. |
| 2002/0028582 A1 | 3/2002 | Nallan et al. |
| 2002/0028585 A1 | 3/2002 | Chung et al. |
| 2002/0029747 A1 | 3/2002 | Powell et al. |
| 2002/0033233 A1 | 3/2002 | Savas |
| 2002/0036143 A1 | 3/2002 | Segawa et al. |
| 2002/0040764 A1 | 4/2002 | Kwan et al. |
| 2002/0045966 A1 | 4/2002 | Lee et al. |
| 2002/0054962 A1 | 5/2002 | Huang |
| 2002/0069820 A1 | 6/2002 | Yudovsky |
| 2002/0070414 A1 | 6/2002 | Drescher et al. |
| 2002/0074573 A1 | 6/2002 | Takeuchi et al. |
| 2002/0098681 A1 | 7/2002 | Hu et al. |
| 2002/0124867 A1 | 9/2002 | Kim et al. |
| 2002/0129769 A1 | 9/2002 | Kim et al. |
| 2002/0177322 A1 | 11/2002 | Li et al. |
| 2002/0187280 A1 | 12/2002 | Johnson et al. |
| 2002/0187655 A1 | 12/2002 | Tan et al. |
| 2002/0197823 A1 | 12/2002 | Yoo et al. |
| 2003/0003757 A1 | 1/2003 | Naltan et al. |
| 2003/0010645 A1 | 1/2003 | Ting et al. |
| 2003/0019428 A1 | 1/2003 | Ku et al. |
| 2003/0019580 A1 | 1/2003 | Strang |
| 2003/0029566 A1 | 2/2003 | Roth |
| 2003/0029715 A1 | 2/2003 | Yu et al. |
| 2003/0032284 A1 | 2/2003 | Enomoto et al. |
| 2003/0038127 A1 | 2/2003 | Liu et al. |
| 2003/0038305 A1 | 2/2003 | Wasshuber |
| 2003/0072639 A1 | 4/2003 | White et al. |
| 2003/0075808 A1 | 4/2003 | Inoue et al. |
| 2003/0077909 A1 | 4/2003 | Jiwari |
| 2003/0079686 A1 | 5/2003 | Chen et al. |
| 2003/0087531 A1 | 5/2003 | Kang et al. |
| 2003/0091938 A1 | 5/2003 | Fairbairn et al. |
| 2003/0098125 A1 | 5/2003 | An |
| 2003/0109143 A1 | 6/2003 | Hsieh et al. |
| 2003/0116087 A1 | 6/2003 | Nguyen et al. |
| 2003/0116439 A1 | 6/2003 | Seo et al. |
| 2003/0121608 A1 | 7/2003 | Chen et al. |
| 2003/0124465 A1 | 7/2003 | Lee et al. |
| 2003/0124842 A1 | 7/2003 | Hytros et al. |
| 2003/0129106 A1 | 7/2003 | Sorensen et al. |
| 2003/0129827 A1 | 7/2003 | Lee et al. |
| 2003/0132319 A1 | 7/2003 | Hytros et al. |
| 2003/0148035 A1 | 8/2003 | Lingampalli |
| 2003/0173333 A1 | 9/2003 | Wang et al. |
| 2003/0173347 A1 | 9/2003 | Guiver |
| 2003/0181040 A1 | 9/2003 | Ivanov et al. |
| 2003/0183244 A1 | 10/2003 | Rossman |
| 2003/0190426 A1 | 10/2003 | Padhi et al. |
| 2003/0199170 A1 | 10/2003 | Li |
| 2003/0221780 A1 | 12/2003 | Lei et al. |
| 2003/0224217 A1 | 12/2003 | Byun et al. |
| 2003/0224617 A1 | 12/2003 | Baek et al. |
| 2004/0005726 A1 | 1/2004 | Huang |
| 2004/0033678 A1 | 2/2004 | Arghavani et al. |
| 2004/0050328 A1 | 3/2004 | Kumagai et al. |
| 2004/0069225 A1 | 4/2004 | Fairbairn et al. |
| 2004/0070346 A1 | 4/2004 | Choi |
| 2004/0072446 A1 | 4/2004 | Liu et al. |
| 2004/0101667 A1 | 5/2004 | O'Loughlin et al. |
| 2004/0110354 A1 | 6/2004 | Natzle et al. |
| 2004/0115876 A1 | 6/2004 | Goundar et al. |
| 2004/0129224 A1 | 7/2004 | Yamazaki |
| 2004/0137161 A1 | 7/2004 | Segawa et al. |
| 2004/0144490 A1 | 7/2004 | Zhao et al. |
| 2004/0147126 A1 | 7/2004 | Yamashita et al. |
| 2004/0154535 A1 | 8/2004 | Chen et al. |
| 2004/0175929 A1 | 9/2004 | Schmitt et al. |
| 2004/0182315 A1 | 9/2004 | Laflamme et al. |
| 2004/0192032 A1 | 9/2004 | Ohmori et al. |
| 2004/0194799 A1 | 10/2004 | Kim et al. |
| 2004/0211357 A1 | 10/2004 | Gadgil et al. |
| 2004/0219789 A1 | 11/2004 | Wood et al. |
| 2004/0245091 A1 | 12/2004 | Karim et al. |
| 2005/0001276 A1 | 1/2005 | Gao et al. |
| 2005/0003676 A1 | 1/2005 | Ho et al. |
| 2005/0009358 A1 | 1/2005 | Choi et al. |
| 2005/0026430 A1 | 2/2005 | Kim et al. |
| 2005/0026431 A1 | 2/2005 | Kazumi et al. |
| 2005/0035455 A1 | 2/2005 | Hu et al. |
| 2005/0048801 A1 | 3/2005 | Karim et al. |
| 2005/0073051 A1 | 4/2005 | Yamamoto et al. |
| 2005/0090120 A1 | 4/2005 | Hasegawa et al. |
| 2005/0098111 A1 | 5/2005 | Shimizu et al. |
| 2005/0112901 A1 | 5/2005 | Ji et al. |
| 2005/0121750 A1 | 6/2005 | Chan et al. |
| 2005/0181588 A1 | 8/2005 | Kim |
| 2005/0199489 A1 | 9/2005 | Stevens et al. |
| 2005/0205110 A1 | 9/2005 | Kao et al. |
| 2005/0214477 A1 | 9/2005 | Hanawa et al. |
| 2005/0218507 A1 | 10/2005 | Kao et al. |
| 2005/0221552 A1 | 10/2005 | Kao et al. |
| 2005/0230350 A1 | 10/2005 | Kao et al. |
| 2005/0236694 A1 | 10/2005 | Wu et al. |
| 2005/0266622 A1 | 12/2005 | Arghavani et al. |
| 2005/0266691 A1 | 12/2005 | Gu et al. |
| 2005/0287771 A1 | 12/2005 | Seamons et al. |
| 2006/0000802 A1 | 1/2006 | Kumar et al. |
| 2006/0000805 A1 | 1/2006 | Todorow et al. |
| 2006/0011298 A1 | 1/2006 | Lim et al. |
| 2006/0019456 A1 | 1/2006 | Bu et al. |
| 2006/0019486 A1 | 1/2006 | Yu et al. |
| 2006/0024954 A1 | 2/2006 | Wu et al. |
| 2006/0024956 A1 | 2/2006 | Zhijian et al. |
| 2006/0033678 A1 | 2/2006 | Lubomirsky et al. |
| 2006/0046419 A1 | 3/2006 | Sandhu et al. |
| 2006/0046484 A1 | 3/2006 | Abatchev et al. |
| 2006/0051966 A1 | 3/2006 | Or et al. |
| 2006/0051968 A1 | 3/2006 | Joshi et al. |
| 2006/0054184 A1 | 3/2006 | Mozetic et al. |
| 2006/0093756 A1 | 5/2006 | Rajagopalan et al. |
| 2006/0102076 A1 | 5/2006 | Smith et al. |
| 2006/0130971 A1 | 6/2006 | Chang et al. |
| 2006/0162661 A1 | 7/2006 | Jung et al. |
| 2006/0166107 A1 | 7/2006 | Chen et al. |
| 2006/0166515 A1 | 7/2006 | Karim et al. |
| 2006/0178008 A1 | 8/2006 | Yeh et al. |
| 2006/0185592 A1 | 8/2006 | Matsuura |
| 2006/0191637 A1 | 8/2006 | Zajac et al. |
| 2006/0207504 A1 | 9/2006 | Hasebe et al. |
| 2006/0210723 A1 | 9/2006 | Ishizaka |
| 2006/0211260 A1 | 9/2006 | Tran et al. |
| 2006/0216923 A1 | 9/2006 | Tran et al. |
| 2006/0226121 A1 | 10/2006 | Aoi |
| 2006/0240661 A1 | 10/2006 | Annapragada et al. |
| 2006/0246717 A1 | 11/2006 | Wang |
| 2006/0251800 A1 | 11/2006 | Weidman et al. |
| 2006/0251801 A1 | 11/2006 | Weidman et al. |
| 2006/0252252 A1 | 11/2006 | Zhu et al. |
| 2006/0261490 A1 | 11/2006 | Su et al. |
| 2006/0264003 A1 | 11/2006 | Eun |
| 2006/0264043 A1 | 11/2006 | Stewart et al. |
| 2006/0266288 A1 | 11/2006 | Choi |
| 2007/0071888 A1 | 3/2007 | Shanmugasundram et al. |
| 2007/0072408 A1 | 3/2007 | Enomoto et al. |
| 2007/0090325 A1 | 4/2007 | Hwang et al. |
| 2007/0099428 A1 | 5/2007 | Shamiryan et al. |
| 2007/0099431 A1 | 5/2007 | Li |
| 2007/0099438 A1 | 5/2007 | Ye et al. |
| 2007/0107750 A1 | 5/2007 | Sawin et al. |
| 2007/0108404 A1 | 5/2007 | Stewart et al. |
| 2007/0111519 A1 | 5/2007 | Lubomirsky et al. |
| 2007/0117396 A1 | 5/2007 | Wu et al. |
| 2007/0123051 A1 | 5/2007 | Arghavani et al. |
| 2007/0163440 A1 | 7/2007 | Kim et al. |
| 2007/0181057 A1 | 8/2007 | Lam et al. |
| 2007/0193515 A1 | 8/2007 | Jeon et al. |
| 2007/0197028 A1 | 8/2007 | Byun et al. |
| 2007/0232071 A1 | 10/2007 | Balseanu et al. |
| 2007/0238321 A1 | 10/2007 | Futase et al. |

(56) References Cited

U.S. PATENT DOCUMENTS

| | | |
|---|---|---|
| 2007/0243685 A1 | 10/2007 | Jiang et al. |
| 2007/0269976 A1 | 11/2007 | Futase et al. |
| 2007/0281106 A1 | 12/2007 | Lubomirsky et al. |
| 2008/0044990 A1 | 2/2008 | Lee |
| 2008/0075668 A1 | 3/2008 | Goldstein |
| 2008/0081483 A1 | 4/2008 | Wu |
| 2008/0085604 A1 | 4/2008 | Hoshino et al. |
| 2008/0099431 A1 | 5/2008 | Kumar et al. |
| 2008/0115726 A1 | 5/2008 | Ingle et al. |
| 2008/0124919 A1 | 5/2008 | Huang et al. |
| 2008/0124937 A1 | 5/2008 | Xu et al. |
| 2008/0142483 A1 | 6/2008 | Hua et al. |
| 2008/0142831 A1 | 6/2008 | Su |
| 2008/0153306 A1 | 6/2008 | Cho et al. |
| 2008/0160210 A1 | 7/2008 | Yang et al. |
| 2008/0162781 A1 | 7/2008 | Haller et al. |
| 2008/0182381 A1 | 7/2008 | Kiyotoshi |
| 2008/0182382 A1 | 7/2008 | Ingle et al. |
| 2008/0182383 A1 | 7/2008 | Lee et al. |
| 2008/0202892 A1 | 8/2008 | Smith et al. |
| 2008/0230519 A1 | 9/2008 | Takahashi |
| 2008/0233709 A1 | 9/2008 | Conti et al. |
| 2008/0261404 A1 | 10/2008 | Kozuka et al. |
| 2008/0268645 A1 | 10/2008 | Kao et al. |
| 2008/0292798 A1 | 11/2008 | Huh et al. |
| 2009/0004849 A1 | 1/2009 | Eun |
| 2009/0017227 A1 | 1/2009 | Fu et al. |
| 2009/0045167 A1 | 2/2009 | Maruyama |
| 2009/0104738 A1 | 4/2009 | Ring et al. |
| 2009/0104764 A1 | 4/2009 | Xia et al. |
| 2009/0104782 A1 | 4/2009 | Lu et al. |
| 2009/0170221 A1 | 7/2009 | Jacques et al. |
| 2009/0189246 A1 | 7/2009 | Wu et al. |
| 2009/0202721 A1 | 8/2009 | Nogami et al. |
| 2009/0255902 A1 | 10/2009 | Satoh et al. |
| 2009/0275205 A1 | 11/2009 | Kiehlbauch et al. |
| 2009/0275206 A1 | 11/2009 | Katz et al. |
| 2009/0277874 A1 | 11/2009 | Rui et al. |
| 2009/0280650 A1 | 11/2009 | Lubomirsky et al. |
| 2010/0048027 A1 | 2/2010 | Cheng et al. |
| 2010/0055917 A1 | 3/2010 | Kim |
| 2010/0059889 A1 | 3/2010 | Gosset et al. |
| 2010/0075503 A1 | 3/2010 | Bencher et al. |
| 2010/0093151 A1 | 4/2010 | Arghavani et al. |
| 2010/0098884 A1 | 4/2010 | Balseanu et al. |
| 2010/0099236 A1 | 4/2010 | Kwon et al. |
| 2010/0099263 A1 | 4/2010 | Kao et al. |
| 2010/0101727 A1 | 4/2010 | Ji |
| 2010/0105209 A1 | 4/2010 | Winniczek et al. |
| 2010/0144140 A1 | 6/2010 | Chandrashekar et al. |
| 2010/0173499 A1 | 7/2010 | Tao et al. |
| 2010/0178755 A1 | 7/2010 | Lee et al. |
| 2010/0187534 A1 | 7/2010 | Nishi et al. |
| 2010/0187588 A1 | 7/2010 | Kim et al. |
| 2010/0187694 A1 | 7/2010 | Yu et al. |
| 2010/0190352 A1 | 7/2010 | Jaiswal |
| 2010/0207205 A1 | 8/2010 | Grebs et al. |
| 2010/0330814 A1 | 12/2010 | Yokota et al. |
| 2011/0008950 A1 | 1/2011 | Xu |
| 2011/0011338 A1 | 1/2011 | Chuc et al. |
| 2011/0034035 A1 | 2/2011 | Liang et al. |
| 2011/0053380 A1 | 3/2011 | Sapre et al. |
| 2011/0081782 A1 | 4/2011 | Liang et al. |
| 2011/0124144 A1 | 5/2011 | Schlemm et al. |
| 2011/0143542 A1 | 6/2011 | Feurprier et al. |
| 2011/0151674 A1 | 6/2011 | Tang et al. |
| 2011/0151676 A1 | 6/2011 | Ingle et al. |
| 2011/0151677 A1 | 6/2011 | Wang et al. |
| 2011/0151678 A1 | 6/2011 | Ashtiani et al. |
| 2011/0155181 A1 | 6/2011 | Inatomi |
| 2011/0159690 A1 | 6/2011 | Chandrashekar et al. |
| 2011/0165771 A1 | 7/2011 | Ring et al. |
| 2011/0180847 A1 | 7/2011 | Ikeda et al. |
| 2011/0195575 A1 | 8/2011 | Wang |
| 2011/0217851 A1 | 9/2011 | Liang et al. |
| 2011/0226734 A1 | 9/2011 | Sumiya et al. |
| 2011/0230052 A1 | 9/2011 | Tang et al. |
| 2011/0266252 A1 | 11/2011 | Thadani et al. |
| 2011/0294300 A1 | 12/2011 | Zhang et al. |
| 2012/0003782 A1 | 1/2012 | Byun et al. |
| 2012/0009796 A1 | 1/2012 | Cui et al. |
| 2012/0025289 A1* | 2/2012 | Liang et al. ............... 257/316 |
| 2012/0068242 A1 | 3/2012 | Shin et al. |
| 2012/0135576 A1 | 5/2012 | Lee et al. |
| 2012/0164839 A1 | 6/2012 | Nishimura |
| 2012/0196447 A1 | 8/2012 | Yang et al. |
| 2012/0211462 A1 | 8/2012 | Zhang et al. |
| 2012/0238102 A1 | 9/2012 | Zhang et al. |
| 2012/0238103 A1 | 9/2012 | Zhang et al. |
| 2012/0285621 A1 | 11/2012 | Tan |
| 2012/0292664 A1 | 11/2012 | Kanike |
| 2012/0309204 A1 | 12/2012 | Kang et al. |
| 2013/0005140 A1 | 1/2013 | Jeng et al. |
| 2013/0034968 A1 | 2/2013 | Zhang et al. |
| 2013/0045605 A1 | 2/2013 | Wang et al. |
| 2013/0052827 A1 | 2/2013 | Wang et al. |
| 2013/0052833 A1 | 2/2013 | Ranjan et al. |
| 2013/0059440 A1 | 3/2013 | Wang et al. |
| 2013/0089988 A1 | 4/2013 | Wang et al. |
| 2013/0119483 A1 | 5/2013 | Alptekin et al. |
| 2013/0187220 A1 | 7/2013 | Surthi |
| 2013/0260533 A1 | 10/2013 | Sapre et al. |
| 2013/0284369 A1 | 10/2013 | Kobayashi et al. |
| 2013/0284370 A1 | 10/2013 | Kobayashi et al. |
| 2013/0302980 A1 | 11/2013 | Chandrashekar et al. |
| 2014/0263272 A1 | 9/2014 | Duan et al. |
| 2014/0273462 A1* | 9/2014 | Simsek-Ege et al. ......... 438/696 |
| 2014/0349477 A1* | 11/2014 | Chandrashekar et al. .... 438/627 |

FOREIGN PATENT DOCUMENTS

| | | |
|---|---|---|
| CN | 101465386 A | 6/2009 |
| EP | 0329406 | 8/1989 |
| EP | 0376252 A2 | 7/1990 |
| EP | 0475567 | 3/1992 |
| EP | 0 496 543 A2 | 7/1992 |
| EP | 0 658 928 A1 | 6/1995 |
| EP | 0697467 A1 | 2/1996 |
| EP | 0913498 | 5/1999 |
| EP | 1099776 | 5/2001 |
| EP | 1107288 | 6/2001 |
| EP | 1496542 | 1/2005 |
| EP | 1568797 | 8/2005 |
| GB | 2285174 | 6/1995 |
| JP | 61-276977 A | 12/1986 |
| JP | 2058836 A | 2/1990 |
| JP | 02-121330 A | 5/1990 |
| JP | 02256235 | 10/1990 |
| JP | 4-239750 | 7/1992 |
| JP | 4-341568 A | 11/1992 |
| JP | 07-130713 A | 5/1995 |
| JP | 7-161703 A | 6/1995 |
| JP | 7297543 | 11/1995 |
| JP | 08-306671 A | 11/1996 |
| JP | 09153481 A | 6/1997 |
| JP | 09-205140 A | 8/1997 |
| JP | 10-178004 A | 6/1998 |
| JP | 2010-154699 | 6/1998 |
| JP | 11124682 | 5/1999 |
| JP | H11-204442 | 7/1999 |
| JP | 2000-012514 A | 1/2000 |
| JP | 2001-308023 | 11/2001 |
| JP | 2002-100578 | 4/2002 |
| JP | 2002-141349 | 5/2002 |
| JP | 2002-222861 A | 8/2002 |
| JP | 2003-019433 | 1/2003 |
| JP | 2003-059914 | 2/2003 |
| JP | 2003-179038 A | 6/2003 |
| JP | 2003-217898 | 7/2003 |
| JP | 2003-318158 A | 11/2003 |
| JP | 2003-347278 A | 12/2003 |
| JP | 2004-047956 A | 2/2004 |
| JP | 2004-156143 A | 6/2004 |
| JP | 04-239723 A | 8/2004 |

(56) References Cited

FOREIGN PATENT DOCUMENTS

| | | |
|---|---|---|
| JP | 2005-033023 A | 2/2005 |
| JP | 2007-173383 A | 7/2007 |
| JP | 08-148470 A | 6/2008 |
| KR | 10-0155601 B1 | 12/1998 |
| KR | 10-0236219 B1 | 12/1999 |
| KR | 1020000008278 A | 2/2000 |
| KR | 2000-0044928 | 7/2000 |
| KR | 2001-0014064 A | 2/2001 |
| KR | 10-2001-0049274 A | 6/2001 |
| KR | 10-2001-0058774 A | 7/2001 |
| KR | 10-2001-0082109 | 8/2001 |
| KR | 1020030096140 | 12/2003 |
| KR | 10-2004-0049739 A | 6/2004 |
| KR | 10-2004-0096365 A | 11/2004 |
| KR | 1020050042701 A | 5/2005 |
| KR | 10-0681390 | 9/2006 |
| KR | 1020080063988 A | 7/2008 |
| KR | 10-2010-0013980 A | 2/2010 |
| KR | 10-2010-0074508 A | 7/2010 |
| KR | 10-1050454 B1 | 7/2011 |
| KR | 1020110126675 A | 11/2011 |
| KR | 1020120082640 A | 7/2012 |
| WO | 92/20833 A1 | 11/1992 |
| WO | 99/26277 A1 | 5/1999 |
| WO | 99/54920 A2 | 10/1999 |
| WO | 99/62108 A2 | 12/1999 |
| WO | 00/13225 A1 | 3/2000 |
| WO | 00/22671 | 4/2000 |
| WO | 01/94719 A1 | 12/2001 |
| WO | 02083981 A2 | 10/2002 |
| WO | 03014416 | 2/2003 |
| WO | 2004/006303 | 1/2004 |
| WO | 2004/074932 | 9/2004 |
| WO | 2004/114366 A2 | 12/2004 |
| WO | 2005036615 A2 | 4/2005 |
| WO | 2006/069085 A2 | 6/2006 |
| WO | 2009/071627 A2 | 6/2009 |
| WO | 2011/087580 A1 | 7/2011 |
| WO | 2011/115761 A2 | 9/2011 |
| WO | 2011/139435 A2 | 11/2011 |
| WO | 2012/018449 A2 | 2/2012 |
| WO | 2012/125654 A2 | 9/2012 |

OTHER PUBLICATIONS

Cho et al., "Dielectric-barrier microdischarge structure for effic ient positive-column plasma using a thick-film ceramic sheet," IEEE Trans. Plasma Sci., vol. 37, No. 8, Aug. 2009, 4 pgs.

Cho, T.S., "Dual Discharge Modes Operation of an Argon Plasma Generated by Commercial Electronic Ballast for Remote Plasma Removal Process," IEEE Transactions on Plasma Science, vol. 42, No. 6, , Jun. 2014, 4 pages.

Cho et al., "Three-dimensional spatiotemporal behaviors of light emission from discharge plasma of alternating current plasma display panels," Appl. Phys. Lett. , vol. 92, No. 22, Jun. 2008, 3pgs.

Cho et al., "Analysis of address discharge modes by using a three-dimensional plasma display panel," IEEE Trans. Plasma Sci. , vol. 36, Oct. 2008, 4 pgs.

C.K. Hu, et al. "Reduced Electromigration of Cu Wires by Surface Coating" Applied Physics Letters, vol. 81, No. 10, Sep. 2, 2002—pp. 1782-1784.

European Search Report dated May 23, 2006 for EP Application No. 05251143.3.

European Examination Report dated Nov. 13, 2007 for EP Application No. 05251143.3. (APPM/008802EP).

EP Partial Search Report, Application No. 08150111.601235/1944796, dated Aug. 22, 2008.

Eze, F. C., "Electroless deposition of CoO thin films," J. Phys. D: Appl. Phys. 32 (1999), pp. 533-540.

Galiano et al. "Stress-Temperature Behavior of Oxide Films Used for Intermetal Dielectric Applications", VMIC Conference, Jun. 9-10, 1992, pp. 100-106.

Goebels, F.J. et al. "Arbitrary Polarization from Annular Slot Planar Antennas," Ire Transactions on Antennas and Propagation, Jul. 1961, 8 pgs.

Iijima, et al., "Highly Selective $SiO_2$ Etch Employing Inductively Coupled Hydro-Fluorocarbon Plasma Chemistry for Self Aligned Contact Etch", Jpn. J. Appl. Phys., Sep. 1997, pp. 5498-5501, vol. 36, Part 1, No. 9A.

International Search Report of PCT/US2009/059743 mailed on Apr. 26, 2010, 4 pages.

International Search Report of PCT/US2012/061726 mailed on May 16, 2013, 3 pages.

International Search Report of PCT/2013/052039 mailed on Nov. 8, 2013, 9 pages.

International Search Report of PCT/2013/037202 mailed on Aug. 23, 2013, 11 pages.

Kim et al., "Pendulum electrons in micro hollow cathode di scharges," IEEE Trans. Plasma Sci. , vol. 36, No. 4, pp. Aug. 2008, 2 pgs.

Lin, et al., "Manufacturing of Cu Electroless Nickel/Sn—Pb Flip Chip Solder Bumps", IEEE Transactions on Advanced Packaging, vol. 22, No. 4 (Nov. 1999), pp. 575-579.

Lopatin, et al., "Thin Electroless barrier for copper films", Part of the SPIE Conference of Multilevel Interconnect technology II, SPIE vol. 3508 (1998), pp. 65-77.

Musaka, "Single Step Gap Filling Technology fo Subhalf Micron Metal Spacings on Plasma Enhanced $TEOS/O^2$ Chemical Vapor Deposition System," Extended Abstracts of the 1993 International Conference on Solid State Devices and Materials pp. 1993, 510-512.

Pearlstein, Fred. "Electroless Plating," J. Res. Natl. Bur. Stan., Ch. 31 (1974), pp. 710-747.

Redolfi et al., "Bulk FinFET fabrication with new approaches for oxide topography control using dry removal techniques," Solid-State Electron., vol. 71, May 2012, 7 pgs.

Saito, et al., "Electroless deposition of Ni—B, Co—B and Ni—Co—B alloys using dimethylamineborane as a reducing agent," Journal of Applied Electrochemistry 28 (1998), pp. 559-563.

Schacham-Diamond, et al., "Electrochemically depostied thin film alloys for ULSI and MEMS applications," Microelectronic Engineering 5 (2000), pp. 525-531.

Schacham-Diamond, et al. "Material properties of electroless 100-200 nm thick CoWP films," Electrochemical Society Proceedings, vol. 99-34, pp. 102-110.

Schoenbach et al.,"High-pressure hollow cathode di scharges," Plasma Sources Sci. Te chnol.,vol. 6, No. 4, Nov. 1997, 10 pgs.

Smayling, et al., "APF® Pitch-Halving for 2nm Logic Cells using Gridded Design Rules", proceedings of the SPIE, 2008, 8 pages.

Vassiliev, et al., "Trends in void-free pre-metal CVD dielectrics," Solid State Technology, Mar. 2001, pp. 129-136.

Weston, et al., "Ammonium Compounds," Kirk-Othmer Encyclopedia of Chemical Technology, 2003,30 pages see pp. 717-718, John Wiley & Sons, Inc.

Yasaka, Y. et al. "Planar microwave discharges with active control of plasma uniformity". Physics of Plasmas, vol. 9 No. 3, Mar. 2002, 7 pgs.

Yosi Shacham-Diamond, et al. "High Aspect Ratio Quarter-Micron Electroless Copper Integrated Technology", Microelectronic Engineering 37/38 (1997) pp. 77-88.

Abraham, "Reactive Facet Tapering of Plasma Oxide for Multilevel Interconnect Applications", IEEE, V-MIC Conference, Jun. 15-16, 1987, pp. 115-121.

Applied Materials, Inc., "Applied Siconi™ Preclean," printed on Aug. 7, 2009, 8 pages.

Carlson, et al., "A Negative Spacer Lithography Process for Sub-100nm Contact Holes and Vias", University of California at Berkeley, Jun. 19, 2007, 4 pages.

Chang et al. "Frequency Effects and Properties of Plasma Deposited Fluorinated Silicon Nitride", J. Vac Sci Technol B 6(2), Mar./Apr. 1988, pp. 524-532.

Cheng, et al., "New Test Structure to Identify Step Coverage Mechanisms in Chemical Vapor Deposition of Silicon Dioxide," Appl. Phys. Lett., 58 (19), May 13, 1991, p. 2147-2149.

Examination Report dated Jun. 28, 2010 for European Patent Application No. 05251143.3. I (APPM/008802 EPC E).

(56) References Cited

OTHER PUBLICATIONS

Fukada et al., "Preparation of SiOF Films with Low Dielectric Constant By ECR Plasma CVD," ISMIC, DUMIC Conference, Feb. 21-22, 1995, pp. 43-49.
Hashim et al., "Characterization of thin oxide removal by RTA Treatment," ICSE 1998 Proc. Nov. 1998, Rangi, Malaysia, pp. 213-216.
Hausmann, et al., "Rapid Vapor Deposition of Highly Conformal Silica Nanolaminates," Science, Oct. 11, 2002, p. 402-406, vol. 298.
Hayasaka, N. et al. "High Quality Low Dielectric Constant SiO2 CVD Using High Density Plasma," Proceedings of the Dry Process Symposium, 1993, pp. 163-168.
Hwang et al., "Smallest Bit-Line Contact of 76nm pitch on NAND Flash Cell by using Reversal PR (Photo Resist) and SADP (Self-Align Double Patterning) Process," IEEE/SEMI Advanced Semiconductor Manufacturing Conference, 2007, 3 pages.
International Search Report and Written Opinion of the International Searching Authority mailed Jul. 3, 2008 (PCT/US05/46226; APPM8802PC02).
International Search Report and Written Opinion for PCT Application No. PCT/US2011/027221, mailed on Nov. 1, 2011, 8 pages.
International Search Report and Written Opinion of PCT/US2010/057676 mailed on Jun. 27, 2011, 9 pages.
International Search Report and Written Opinion of PCT/US2011/030582 mailed Dec. 7, 2011, 9 pages.
International Search Report and Written Opinion of PCT/US2011/064724 mailed on Oct. 12, 2012, 8 pages.
International Search Report and Written Opinion of PCT/US2012/028952 mailed on Oct. 29, 2012, 9 pages.
International Search Report and Written Opinion of PCT/US2012/048842 mailed on Nov. 28, 2012, 10 pages.
International Search Report and Written Opinion of PCT/US2012/053329 mailed on Feb. 15, 2013, 8 pages.
International Search Report and Written Opinion of PCT/US2012/057294 mailed on Mar. 18, 2013, 12 pages.
International Search Report and Written Opinion of PCT/US2012/057358 mailed on Mar. 25, 2013, 10 pages.
International Search Report and Written Opinion of PCT/US2012/058818 mailed on Apr. 1, 2013, 9 pages.
International Search Report and Written Opinion of the International Searching Authority for PCT Application No. PCT/US2012/028957, mailed on Oct. 18, 2012, 9 pages.
International Search report and Written Opinion of PCT/CN2010/000932 dated Mar. 31, 2011, 8 pages.
Japanese Patent Office, Official Action for Application No. 2007-317207 mailed on Dec. 21, 2011, 2 pages.
International Search Report and Written Opinion of PCT/US2013/076217 mailed on Apr. 28, 2014, 11 pages.
Jung, et al., "Patterning with amorphous carbon spacer for expanding the resolution limit of current lithography tool", Proc. SPIE , 2007, 9 pages, vol. 6520, 65201C.
Laxman, "Low ϵ Dielectrics: CVD Fluorinated Silicon Dioxides", Semiconductor International, May 1995, pp. 71-74.
Lee, et al., "Dielectric Planarization Techniques for Narrow Pitch Multilevel Interconnects," IEEE, V-MIC Conference Jun. 15-16, 1987, pp. 85-92 (1987).

Matsuda, et al. "Dual Frequency Plasma CVD Fluorosilicate Glass Deposition for 0.25 um Interlevel Dielectrics", ISMIC, DUMIC Conference Feb. 21-22, 1995, pp. 22-28.
Meeks, Ellen et al., "Modeling of $SiO_2$ deposition in high density plasma reactors and comparisons of model predictions with experimental measurements," J. Vac. Sci. Technol. A, Mar./Apr. 1998, pp. 544-563, vol. 16(2).
Mukai, et al., "A Study of CD Budget in Spacer Patterning Process", Toshiba, SPIE 2008, Feb. 26, 2008, 12 pages.
Nishino, et al.; Damage-Free Selective Etching of SI Native Oxides Using NH3/NF3 and SF6/H20 Down-Flow Etching, The Japanese Society of Applied Physics, vol. 74, No. 2, pp. 1345-1348, XP-002491959, Jul. 15, 1993.
Ogawa, et al., "Dry Cleaning Technology for Removal of Silicon Native Oxide Employing Hot NH3/NF3 Exposure", Japanese Journal of Applied Physics, pp. 5349-5358, Aug. 2002, vol. 41 Part 1, No. 8.
Ota, et al., "Stress Controlled Shallow Trench Isolation Technology to Suppress the Novel Anti-Isotropic Impurity Diffusion for 45nm-Node High Performance CMOSFETs," Symposium on VLSI Technology Digest of Technical Papers, 2005, pp. 138-139.
Qian, et al., "High Density Plasma Deposition and Deep Submicron Gap Fill with Low Dielectric Constant SiOF Films," ISMIC, DUMIC Conference Feb. 21-22, 1995, pp. 50-56.
Robles, et al. "Effects of RF Frequency and Deposition Rates on the Moisture Resistance of PECVD TEOS-Based Oxide Films", ECS Extended Abstracts, Abstract No. 129, May 1992, pp. 215-216, vol. 92-1.
Shapiro, et al. "Dual Frequency Plasma CVD Fluorosilicate Glass: Water Absorption and Stability", ISMIC, DUMIC Conference Feb. 21-22, 1995, pages 118-123.
S.M. Sze, VLSI Technology, McGraw-Hill Book Company, pp. 107, 108.
C.C. Tang and D. W. Hess, Tungsten Etching in CF4 and SF6 Discharges, J. Electrochem. Soc., 1984, 131 (1984) p. 115-120.
Usami, et al., "Low Dielectric Constant Interlayer Using Fluorine-Doped Silicon Oxide", Jpn. J. Appl. Phys., Jan. 19, 1994. pp. 408-412, vol. 33 Part 1, No. 1B.
Wang et al.; Ultra High-selectivity silicon nitride etch process using an inductively coupled plasma source; J. Vac. Sci. Techno!. A 16(3), May/Jun. 1998, pp. 1582-1587.
Wolf et al.; Silicon Processing for the VLSI Era; vol. 1; 1986; Lattice Press, pp. 546, 547, 618, 619.
Yang, R., "Advanced in situ pre-Ni silicide (Siconi) cleaning at 65 nm to resolve defects in NiSix modules," J. Vac. Sci., Technol. B, Microelectron. Nanometer Struct., vol. 28, No. 1, Jan. 2010, 6 pgs.
Yasuda et al., "Dual-function remote plasma etching/cleaning system applied to selective etiching of Si02 and removal of polymeric residues," J. Vac. Sci. Technol., A, vol. 11, No. 5, 1993, 12 pgs.
Yu, et al., "Step Coverage Study of Peteos Deposition for Intermetal Dielectric Applications," abstract, VMIC conference, Jun. 12-13, 1990, 7 pages, No. 82.
Yutaka, et al., "Selective Etching of Silicon Native Oxide with Remote-Plasma-Excited Anhydrous Hydrogen Fluoride," Japanese Journal of Applied Physics, 1998, vol. 37, pp. L536-L538.

* cited by examiner

INTEGRATED OXIDE AND NITRIDE RECESS FOR BETTER CHANNEL CONTACT IN 3D ARCHITECTURES

FIELD

Embodiments of the invention relate to methods of forming 3-d flash memory.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers or thinning lateral dimensions of features already present on the surface. Often it is desirable to have an etch process which etches one material faster than another helping e.g. a pattern transfer process proceed. Such an etch process is said to be selective of the first material. As a result of the diversity of materials, circuits and processes, etch processes have been developed that selectively remove one or more of a broad range of materials.

Dry etch processes are increasingly desirable for selectively removing material from semiconductor substrates. The desirability stems from the ability to gently remove material from miniature structures with minimal physical disturbance. Dry etch processes also allow the etch rate to be abruptly stopped by removing the gas phase reagents. Some dry-etch processes involve the exposure of a substrate to remote plasma by-products formed from one or more precursors. For example, remote plasma generation of nitrogen trifluoride in combination with ion suppression techniques enables silicon to be isotropically and selectively removed from a patterned substrate when the plasma effluents are flowed into the substrate processing region.

Methods are needed to broaden the utility of selective dry isotropic etch processes.

SUMMARY

Methods of etching back an oxide-nitride-oxide (ONO) layer of a 3-d flash memory cell without breaking vacuum are described. The methods include recessing the two outer silicon oxide dielectric layers to expose the flanks of the thin silicon nitride layer. The silicon nitride layer is then etched back from all exposed sides to hasten the process on the same substrate processing mainframe. Both etching back the silicon oxide and etching back the silicon nitride use remotely excited fluorine-containing apparatuses attached to the same mainframe to facilitate performing both operations without an intervening atmospheric exposure. The process may also be reversed such that the silicon nitride is etched back first.

Embodiments include methods of forming a 3-d flash memory cell. The methods include transferring a patterned substrate into a substrate processing mainframe. The patterned substrate comprises a vertical stack of alternating silicon oxide and silicon nitride slabs surrounding a vertical memory hole and a conformal ONO layer overlying the vertical stack. The conformal ONO layer comprises a first silicon oxide layer, a silicon nitride layer and a second silicon oxide layer. The methods further include transferring the patterned substrate into a first substrate processing chamber mounted on the substrate processing mainframe. The methods further include flowing a first fluorine-containing precursor into a first remote plasma region within the first substrate processing chamber while striking a plasma to form first plasma effluents from a combination of the fluorine-containing precursor and the hydrogen-containing precursor. The methods further include flowing the first plasma effluents into a first substrate processing region within the first substrate processing chamber. The first substrate processing region houses the patterned substrate. The methods further include reacting the first plasma effluents with the conformal ONO layer to etch back the first silicon oxide layer and the second silicon oxide layer. The methods further include transferring the patterned substrate without breaking vacuum from the first substrate processing chamber to a second substrate processing chamber mounted on the substrate processing mainframe. The methods further include flowing a second fluorine-containing precursor and an oxygen-containing precursor into a second remote plasma region within the second substrate processing chamber while striking a plasma to form second plasma effluents and flowing the second plasma effluents through a showerhead into a second substrate processing region housing the patterned substrate within the second substrate processing chamber. The methods further include reacting the second plasma effluents with the conformal ONO layer to etch back the silicon nitride layer. The methods further include removing the patterned substrate from the substrate processing mainframe.

Embodiments include methods of forming a 3-d flash memory cell. The methods include transferring a patterned substrate into a substrate processing mainframe. The patterned substrate comprises a vertical stack of alternating silicon oxide and silicon nitride slabs and a conformal ONO layer overlying the vertical stack. The conformal ONO layer comprises a first silicon oxide layer, a silicon nitride layer and a second silicon oxide layer. The methods further include transferring the patterned substrate into a first substrate processing chamber mounted on the substrate processing mainframe. The methods further include flowing a first fluorine-containing precursor into a first remote plasma region within the first substrate processing chamber while striking a plasma to form first plasma effluents from a combination of the fluorine-containing precursor and the hydrogen-containing precursor. The methods further include flowing the first plasma effluents into a first substrate processing region within the first substrate processing chamber. The first substrate processing region houses the patterned substrate. The methods further include reacting the first plasma effluents with the conformal ONO layer. The methods further include transferring the patterned substrate without breaking vacuum from the first substrate processing chamber to a second substrate processing chamber mounted on the substrate processing mainframe. The methods further include flowing a second fluorine-containing precursor into a second remote plasma region within the second substrate processing chamber while striking a plasma to form second plasma effluents and flowing the second plasma effluents through a showerhead into a second substrate processing region housing the patterned substrate within the second substrate processing chamber. The methods further include reacting the second plasma effluents with the conformal ONO layer. The methods further include removing the patterned substrate from the substrate processing mainframe. The patterned substrate is not exposed to atmosphere between transferring the patterned substrate into the substrate processing mainframe and removing the patterned substrate from the substrate processing mainframe.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

DESCRIPTION OF THE DRAWINGS

A further understanding of the nature and advantages of the embodiments may be realized by reference to the remaining portions of the specification and the drawings.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Methods of etching back an oxide-nitride-oxide (ONO) layer of a 3-d flash memory cell without breaking vacuum are described. The methods include recessing the two outer silicon oxide dielectric layers to expose the flanks of the thin silicon nitride layer. The silicon nitride layer is then etched back from all exposed sides to hasten the process on the same substrate processing mainframe. Both etching back the silicon oxide and etching back the silicon nitride use remotely excited fluorine-containing apparatuses attached to the same mainframe to facilitate performing both operations without an intervening atmospheric exposure. The process may also be reversed such that the silicon nitride is etched back first.

Recently-developed gas-phase remote etch processes have been designed, in part, to remove the need to expose delicate surface patterns to liquid etchants. Liquid etchants are increasingly responsible for collapsing delicate surface patterns as linewidths are reduced. Further improvements in yields, performance and cost reduction are enabled by the methods presented herein. The methods involve performing several operations in the same substrate processing mainframe with multiple substrate processing chambers attached, generally around the perimeter of the mainframe. All semiconductor process chambers may be under vacuum aside from the process gases periodically introduced to treat a substrate. Prior art liquid etch processes are not candidates for such integration and so new process flows are now possible.

Figure 1A:
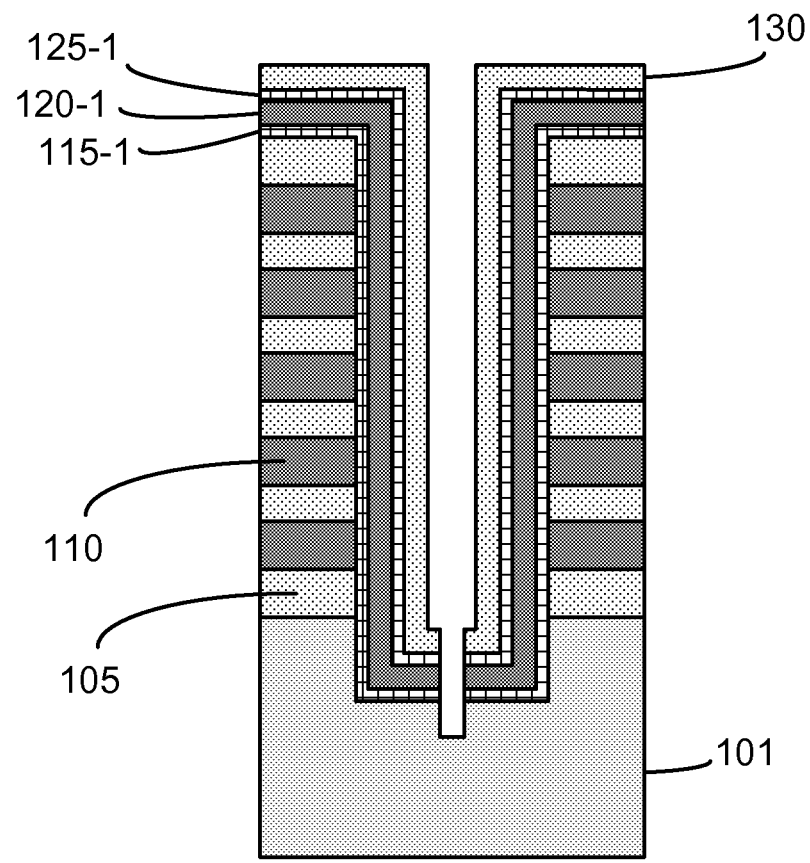
FIGS. 1A, 1B and 1C are cross-sectional views of a patterned substrate during an integrated etch process according to embodiments.
Figure 1B:
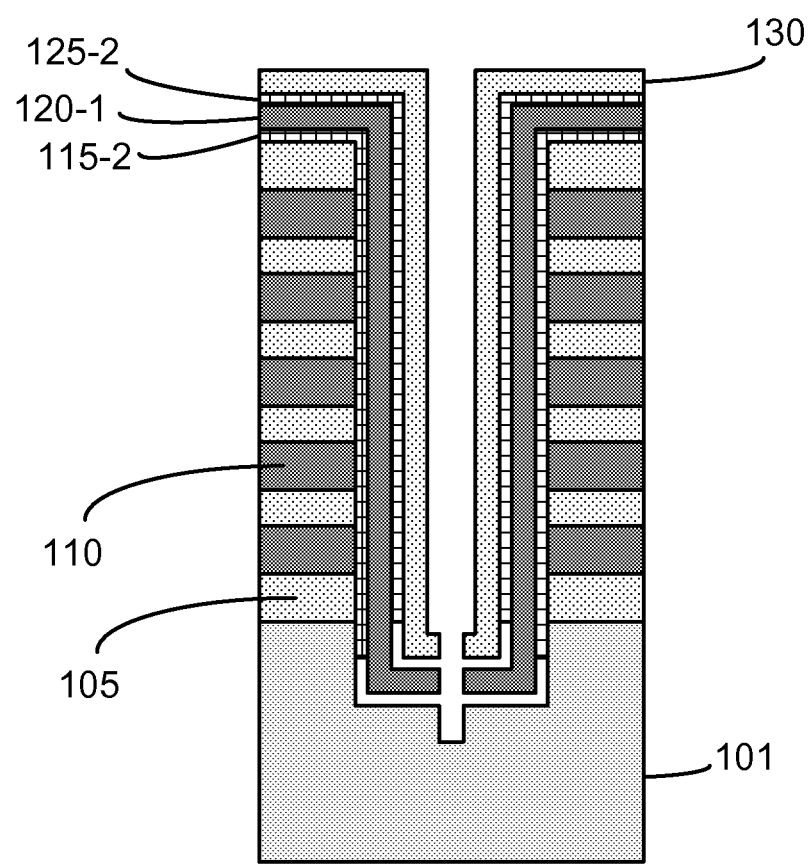
Figure 1C:
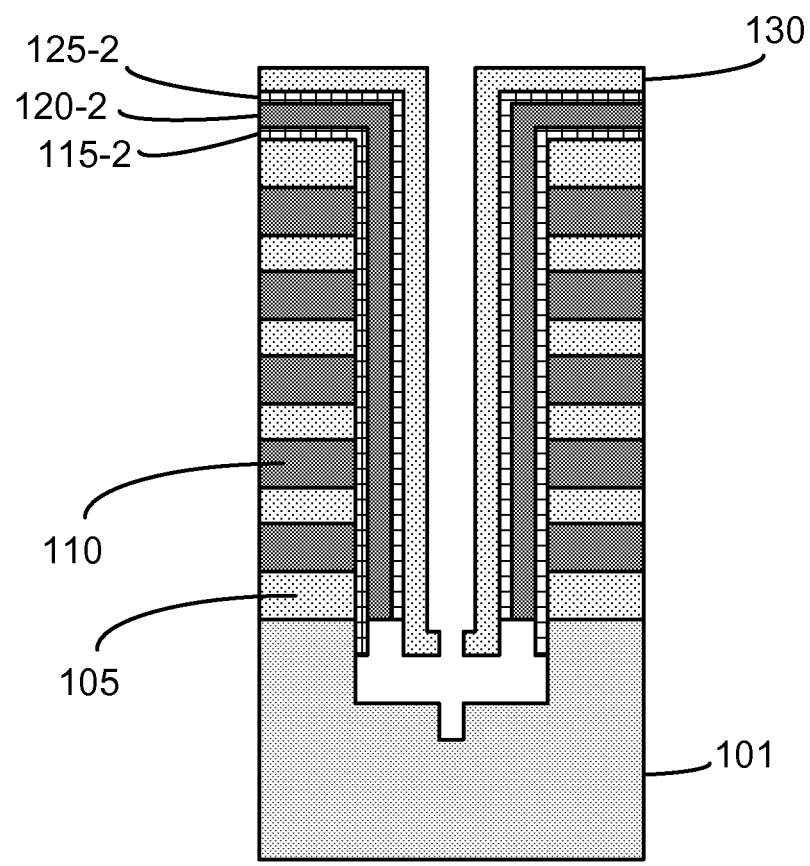
Figure 2:
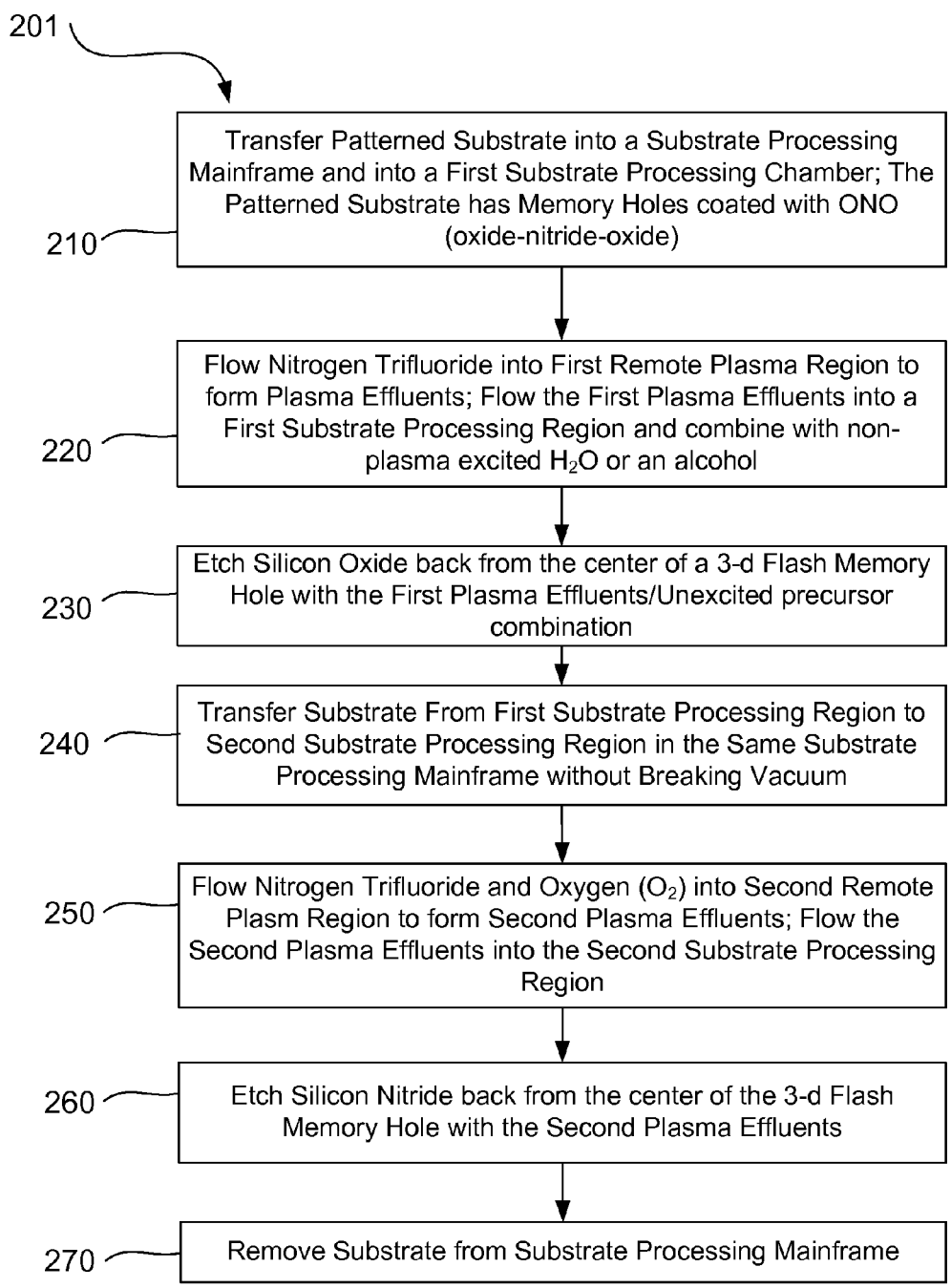
FIG. 2 is a flow chart of an integrated etch process according to embodiments.

In order to better understand and appreciate embodiments of the invention, reference is now made to FIGS. 1A, 1B and 1C which are cross-sectional views of a 3-d flash memory cell during a method 201 (see FIG. 2) of forming the 3-d flash memory cells according to embodiments. In one example, a flash memory cell on patterned substrate 101 comprises alternatively stacked silicon oxide 105 and silicon nitride 110. The silicon nitride is sacrificial and is intended for replacement with a conductor before the device is completed. The stack of silicon oxide 105 and silicon nitride 110 is conformally covered with a conformal ONO layer. The ONO layer includes a silicon oxide layer 115-1 (often referred to as IPD or interpoly dielectric), a silicon nitride layer 120-1 (which serves as the charge trap layer) and a silicon oxide layer 125-1 (the gate dielectric). The ONO layer is further covered with a polysilicon layer 130 which provides the channel silicon. "Top" and "Up" will be used herein to describe portions/directions perpendicularly distal from the substrate plane and further away from the center of mass of the substrate in the perpendicular direction. "Vertical" will be used to describe items aligned in the "Up" direction towards the "Top". Other similar terms may be used whose meanings will now be clear.

The ONO layer comprises a horizontal portion and a vertical portion. The horizontal portion on top of the stack is outside the memory hole. The vertical portion of the ONO layer may be in contact with both stacked silicon oxide 105 layers and stacked silicon nitride 110 layers in embodiments. The vertical portion of the ONO layer may be in contact with polysilicon layer 130 according to embodiments. The horizontal portion of the ONO layer within the vertical memory hole may be in contact polysilicon layer 130 in embodiments. The vertical memory hole may be circular as viewed from above. Silicon oxide layer 115-1 may be in contact with silicon nitride layer 120-1, which may be in contact with silicon oxide layer 125-1 in embodiments. Silicon oxide layer 115-1 may contact stacked silicon oxide 105 layers and stacked silicon nitride layers 110 whereas silicon oxide layer 125-1 may contact polysilicon layer 130 in embodiments.

The thickness of polysilicon layer 130 depicted in each of FIGS. 1A-C may less than or about 10 nm or less than or about 10 nm according to embodiments. Silicon oxide layer 115-1 may have a thickness less than or about 8 nm or less than 6 nm in embodiments. Silicon oxide layer 115-1 may comprise or consist of silicon and oxygen in embodiments. Silicon nitride 120-1 may have a thickness less than or about 8 nm or less than 6 nm in embodiments. Silicon nitride layer 120-1 may comprise or consist of silicon and nitrogen in embodiments. Silicon oxide layer 125-1 may have a thickness less than or about 8 nm or less than 6 nm in embodiments. Silicon oxide layer 125-1 may comprise or consist of silicon and oxygen in embodiments. The constrained geometries and thinness of the layers result in damage to the memory cell when liquid etchants are used, further motivating the gas-phase etching methods presented herein. Liquid etchants cannot be as completely removed and continue to etch. Liquid etchants may ultimately form and/or penetrate through pinholes and damage devices after manufacturing is complete. Prior to the operations of method 201, a punch-through etch is performed to make the small trench through the ONO layers as shown near the bottom of FIG. 1A. Alternatively, the punch-through etch may be performed after entering a substrate processing mainframe.

Patterned substrate 101 as shown in FIG. 1A is delivered into a substrate processing system (e.g. a single substrate processing mainframe) having multiple substrate processing chambers affixed and evacuated prior to transfer. Patterned substrate 101 is transferred into a first substrate processing region within a first substrate processing chamber (operation 210) to initiate method 201 of forming a flash memory cell. A flow of nitrogen trifluoride is then introduced into a first remote plasma region where the nitrogen trifluoride is excited in a remote plasma struck within the separate plasma region in operation 220. A separate plasma region may be referred to as a remote plasma region herein and may be within a distinct module from the processing chamber or a compartment within the processing chamber separated from the substrate processing region by an aperture or a showerhead. In general, a fluorine-containing precursor may be flowed into the remote plasma region and the fluorine-containing precursor comprises at least one precursor selected from the group consisting of atomic fluorine, diatomic fluorine, bromine trifluoride, chlorine trifluoride, nitrogen trifluoride, hydrogen fluoride, fluorinated hydrocarbons, sulfur hexafluoride and xenon difluoride.

According to embodiments, the plasma effluents may pass through a showerhead and/or ion suppressor to reduce the electron temperature (to reduce the ion concentration) in the substrate processing region. Reduced electron temperatures as described subsequently herein have been found to increase the etch selectivity of gapfill silicon oxide compared to other exposed materials (e.g. polysilicon). The low electron temperatures are described later in the specification (e.g. <0.5 eV). Electron temperatures do not need to be this low if a hydrogen-containing precursor, such as ammonia, is also present in the first remote plasma region during operation 220.

In embodiments, a hydrogen-containing precursor, e.g. ammonia, may be simultaneously flowed into the first remote plasma region along with the nitrogen trifluoride described previously. The hydrogen-containing precursor may be flowed into the first remote plasma region. Generally speaking, the hydrogen-containing precursor may include one or more of atomic hydrogen, molecular hydrogen, ammonia, a hydrocarbon and an incompletely halogen-substituted hydrocarbon.

Alternatively, an unexcited precursor may be flowed directly into the first substrate processing region without first passing the unexcited precursor through any plasma prior to entering the first substrate processing region during operation 220. The unexcited precursor may be excited only by the plasma effluents formed in the first remote plasma region. The unexcited precursor may be water or an alcohol (each of which contains an OH group) in embodiments. The unexcited precursor may also be NxHy (with x and y each greater than or equal to one), and may be flowed directly into first substrate processing region without prior plasma excitation. For example, the unexcited precursor may be ammonia in embodiments. The presence of the unexcited precursor just described may increase silicon oxide selectivity for etch operation 220. As before, the plasma effluents may pass through a showerhead and/or ion suppressor to reduce the electron temperature (to reduce the ion concentration) in the substrate processing region prior to combination with unexcited NxHy or OH group precursor. Reduced electron temperatures as described subsequently herein have been found to increase the etch selectivity of gapfill silicon oxide relative to other exposed materials, such as polysilicon.

Formed by the various means presented above, the plasma effluents formed in the remote plasma region are then flowed into the substrate processing region and patterned substrate 101 is selectively etched in operation 230 of method 201. Operation 230 (and all etches described herein) may be referred to as a gas-phase etch to highlight the contrast with liquid etch processes. The plasma effluents may enter the substrate processing region through through-holes in a showerhead or another style of aperture which separates the remote plasma region from the substrate processing region. In operation 230, silicon oxide layer 115-1 and silicon oxide layer 125-1 of the conformal ONO layer are removed at a much higher rate than polysilicon layer 130 to etch back the horizontal portions of silicon oxide layer 115-1 and silicon oxide layer 125-1. The horizontal portions of silicon oxide layer 115-1 and silicon oxide layer 125-1 may be removed leaving only vertical portions of silicon oxide layer 115-1 and silicon oxide layer 125-1. FIG. 1B shows the remaining portion of the ONO layer following etch operation 230. Silicon oxide layer 115-2 and silicon oxide layer 125-2 possess only vertical portions within the vertical memory hole. The reactive chemical species are removed from the substrate processing region.

Operation 220 may include applying energy to the fluorine-containing precursor while in the remote plasma region to generate the plasma effluents. As would be appreciated by one of ordinary skill in the art, the plasma may include a number of charged and neutral species including radicals and ions. The plasma may be generated using known techniques (e.g., radio frequency excitations, capacitively-coupled power or inductively coupled power). In an embodiment, the energy is applied using a capacitively-coupled plasma unit. The remote plasma source power may be between about 5 watts and about 5000 watts, between about 25 watts and about 1500 watts or between about 50 watts and about 1000 watts according to embodiments. The pressure in the remote plasma region may be such that the pressure in the substrate processing region ends up between about 0.01 Torr and about 50 Torr or between about 0.1 Torr and about 5 Torr in embodiments. The capacitively-coupled plasma unit may be disposed remote from a substrate processing region of the processing chamber. For example, the capacitively-coupled plasma unit and the plasma generation region may be separated from the gas reaction region by a showerhead. All process parameters for the silicon oxide layer etch operation described herein apply to all remote plasma embodiments herein unless otherwise indicated. Other plasma parameters will be described in the exemplary equipment section.

Including a hydrogen-containing precursor with the fluorine-containing precursor in the first remote plasma region creates plasma effluents which produce solid etch by-products while etching silicon oxide layer 115-1 and silicon oxide layer 125-1. The solid etch by-products form on the surface when the patterned substrate temperature is less than 80° C., less than 70° C. or less than 60° C. in embodiments. In this case, the solid etch by-products may be removed by sublimation effected by raising the patterned substrate temperature above 80° C., 90° C. or 100° C. according to embodiments. The exposure to plasma effluents followed by sublimation may be repeated an integral number of times to remove the desired amount. The exposure to plasma effluents followed by sublimation may occur at least one, two, three, or four times, in embodiments. Lower remote plasma powers have been found to be effective when using hydrogen-containing precursor in addition to the fluorine-containing precursor in the first remote plasma region. The remote plasma source power may be between about 0.5 watts and about 500 watts, between about 3 watts and about 150 watts or between about 10 watts and about 100 watts according to embodiments. Forming and sublimating residue is less desirable than the unexcited precursor method due to the constrained geometry restricting access to the thin silicon oxide layers.

Patterned substrate 101 is removed from first substrate processing region and placed in a second substrate processing region within a second substrate processing chamber affixed to the same substrate processing mainframe in operation 240. An air-tight seal is maintained between the atmosphere outside the substrate processing mainframe and the interior of substrate processing mainframe during operation 240, a trait which may also be referred to as transferring "without breaking vacuum". Avoiding atmospheric exposure prevents the formation of a native oxide on polysilicon layer 130.

A flow of nitrogen trifluoride and oxygen ($O_2$) are then introduced into a second remote plasma region inside the second substrate processing region where the nitrogen trifluoride is excited in a second remote plasma struck within the second remote plasma region. Remote plasma parameters may be the same embodiments described for operation 220 and in the exemplary equipment section. In general, a fluorine-containing precursor and an oxygen-containing precursor may be flowed into the second remote plasma region. The fluorine-containing precursor comprises at least one precursor selected from the group consisting of atomic fluorine, diatomic fluorine, bromine trifluoride, chlorine trifluoride, nitrogen trifluoride, hydrogen fluoride, fluorinated hydrocarbons, sulfur hexafluoride and xenon difluoride in embodiments. The oxygen-containing precursor may be one of atomic oxygen, molecular oxygen ($O_2$), ozone ($O_3$), nitrogen dioxide or nitrous oxide in embodiments.

Plasma effluents are formed and passed into a second substrate processing region (operation 250) now housing patterned substrate 101. A portion of silicon nitride layer 120-1 (the center layer of the conformal ONO layer) is removed in operation 260 to remove the horizontal portion of silicon nitride layer 120-1 to form silicon nitride layer 120-2 as shown in FIG. 1C. Etching silicon oxide layer 115-1 and silicon oxide layer 125-1 creates greater access to more exposed surfaces of silicon nitride layer 120-1 which increases the effective removal rate of silicon nitride layer 120-1. Silicon nitride generally displays a lower etch rate than silicon oxide. However, the order of operations 230 and 260 may be reversed meaning that silicon nitride layer 120-1 may be etched (in the first substrate processing region with the chemicals of operation 250) before silicon oxide layer 115-1 and silicon oxide layer 125-1 (which would then be etched in the second substrate processing region with the chemicals of operation 220) in embodiments. Unused process effluents are removed from the second substrate processing region and patterned substrate 101 is removed from the second substrate processing region and then removed from the substrate processing mainframe (operation 270). Other processes may be carried out before removing patterned substrate 101 from the substrate processing mainframe according to embodiments.

All plasmas described herein may further include one or more relatively inert gases such as He, $N_2$, Ar. The inert gas can be used to improve plasma stability or process uniformity. Argon is helpful, as an additive, to promote the formation of a stable plasma. Process uniformity is generally increased when helium is included. These additives are present in embodiments throughout this specification. Flow rates and ratios of the different gases may be used to control etch rates and etch selectivity.

In all relevant operations (e.g. 220 and 250) embodiments described herein, the fluorine-containing gas (e.g. $NF_3$) is supplied at a flow rate of between about 5 sccm (standard cubic centimeters per minute) and 400 sccm, He at a flow rate of between about 0 slm (standard liters per minute) and 3 slm, and $N_2$ at a flow rate of between about 0 slm and 3 slm. The flow rates of ammonia, the oxygen-containing precursor, the alcohol, moisture vary widely and are selected to choose a desirable etch rate and etch selectivity of the target etch material. One of ordinary skill in the art would recognize that other gases and/or flows may be used depending on a number of factors including processing chamber configuration, substrate size and geometry and layout of features being etched.

In addition to the other embodiments described herein, the pressure in the remote plasma region and/or the substrate processing region during all selective etch processes may be between about 0.01 Torr and about 30 Torr or between about 1 Torr and about 5 Torr in embodiments. The remote plasma region is disposed remote from the substrate processing region. The remote plasma region is fluidly coupled to the substrate processing region and both regions may be at roughly the same pressure during processing.

The temperature of the substrate may be between about −20° C. and about 200° C. during gapfill silicon oxide selective etch and selective etch operations later in the process. The patterned substrate temperature may also be maintained at between −10° C. and about 50° C. or between about 5° C. and about 25° C. during the gas-phase etching processes disclosed herein. Performing etching operations 230 and 260 at these extraordinarily low temperatures avoids outdiffusion of boron (or another dopant) from polysilicon layer 120-1, if the polysilicon has been doped at this point of the process.

In embodiments, an ion suppressor (which may be the showerhead) may be used to provide radical and/or neutral species for gas-phase etching. The ion suppressor may also be referred to as an ion suppression element. In embodiments, for example, the ion suppressor is used to filter etching plasma effluents (including radical-fluorine) en route from the remote plasma region to the substrate processing region. The ion suppressor may be used to provide a reactive gas having a higher concentration of radicals than ions. Plasma effluents pass through the ion suppressor disposed between the remote plasma region and the substrate processing region. The ion suppressor functions to dramatically reduce or substantially eliminate ionic species traveling from the plasma generation region to the substrate. The ion suppressors described herein are simply one way to achieve a low electron temperature in the substrate processing region during the gas-phase etch processes described herein.

In embodiments, an electron beam is passed through the substrate processing region in a plane parallel to the substrate to reduce the electron temperature of the plasma effluents. A simpler showerhead may be used if an electron beam is applied in this manner. The electron beam may be passed as a laminar sheet disposed above the substrate in embodiments. The electron beam provides a source of neutralizing negative charge and provides a more active means for reducing the flow of positively charged ions towards the substrate and increasing the selectivity of silicon oxide or silicon nitride in embodiments. The flow of plasma effluents and various parameters governing the operation of the electron beam may be adjusted to lower the electron temperature measured in the substrate processing region.

The electron temperature may be measured using a Langmuir probe in the substrate processing region during excitation of a plasma in the remote plasma. In embodiments, the electron temperature may be less than 0.5 eV, less than 0.45 eV, less than 0.4 eV, or less than 0.35 eV. These extremely low values for the electron temperature are enabled by the presence of the electron beam, showerhead and/or the ion suppressor. Uncharged neutral and radical species may pass through the electron beam and/or the openings in the ion suppressor to react at the substrate. Such a process using radicals and other neutral species can reduce plasma damage compared to conventional plasma etch processes that include sputtering and bombardment. Embodiments of the present invention are also advantageous over conventional wet etch processes where surface tension of liquids can cause bending and peeling of small features.

The substrate processing region may be described herein as "plasma-free" during the etch processes described herein. "Plasma-free" does not necessarily mean the region is devoid of plasma. Ionized species and free electrons created within the plasma region may travel through pores (apertures) in the partition (showerhead) at exceedingly small concentrations. The borders of the plasma in the chamber plasma region are hard to define and may encroach upon the substrate processing region through the apertures in the showerhead. Furthermore, a low intensity plasma may be created in the substrate processing region without eliminating desirable features of the etch processes described herein. All causes for a plasma having much lower intensity ion density than the chamber plasma region during the creation of the excited plasma effluents do not deviate from the scope of "plasma-free" as used herein.

The etch selectivities during the silicon oxide etches described herein (silicon oxide:polysilicon) may be greater than or about 300:1, greater than or about 500:1, greater than or about 750:1, or greater than or about 1000:1 in embodiments. For the silicon nitride etching operations, the etch selectivity of silicon nitride to silicon (e.g. polysilicon) may be greater than or about 100:1, greater than or about 200:1, greater than or about 300:1 or greater than or about 500:1 according to embodiments.

Additional process parameters are disclosed in the course of describing an exemplary processing chamber and system.

Exemplary Processing System

Figure 3A:
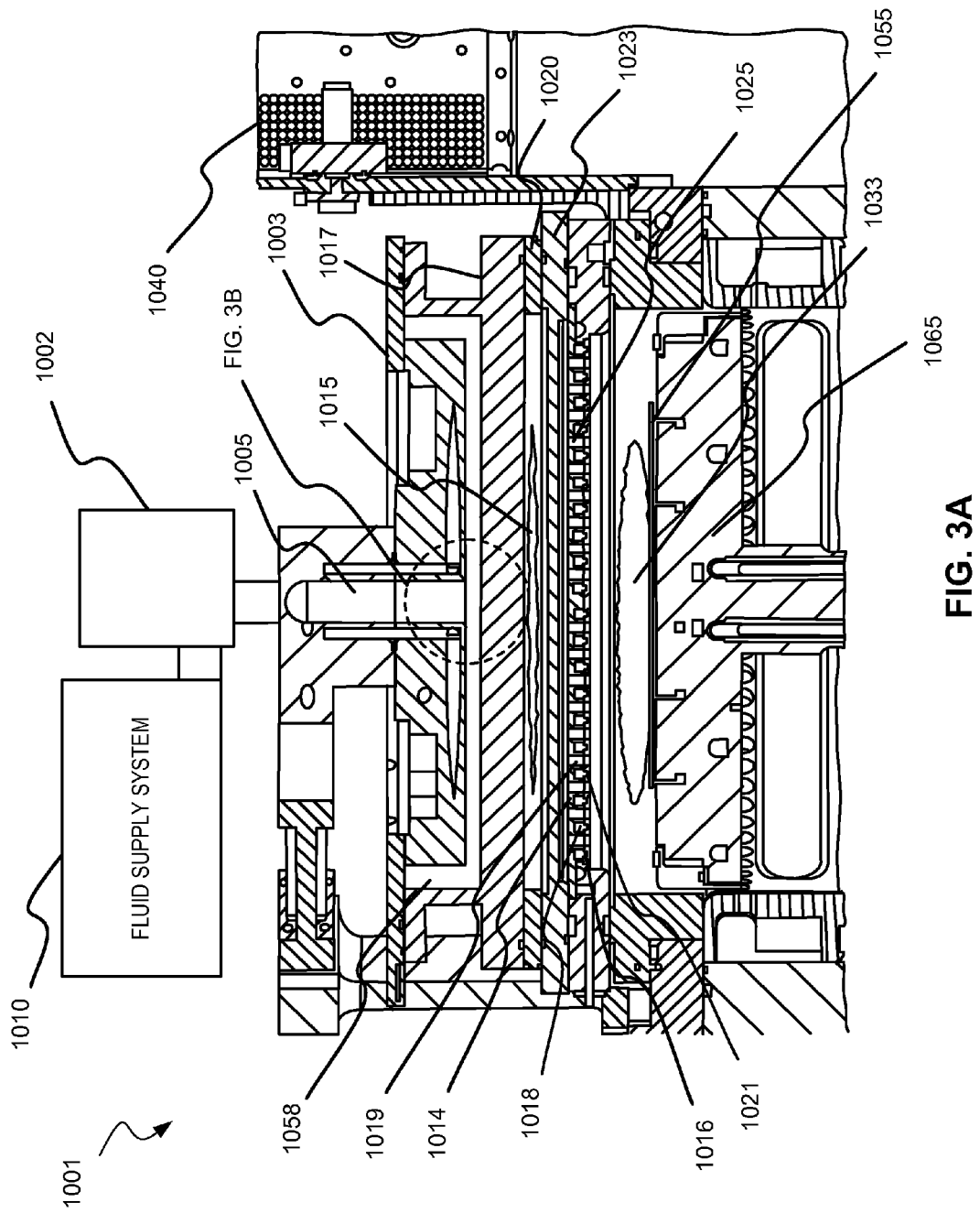
FIG. 3A shows a schematic cross-sectional view of a substrate processing chamber according to embodiments.

FIG. 3A shows a cross-sectional view of an exemplary substrate processing chamber 1001 with partitioned plasma generation regions within the processing chamber. During film etching, e.g., silicon oxide or polysilicon, etc., a process gas may be flowed into chamber plasma region 1015 through a gas inlet assembly 1005. A remote plasma system (RPS) 1002 may optionally be included in the system, and may process a first gas which then travels through gas inlet assembly 1005. The inlet assembly 1005 may include two or more distinct gas supply channels where the second channel (not shown) may bypass the RPS 1002, if included. Accordingly, in embodiments the precursor gases may be delivered to the processing chamber in an unexcited state. In another example, the first channel provided through the RPS may be used for the process gas and the second channel bypassing the RPS may be used for a treatment gas in embodiments. The process gas may be excited within the RPS 1002 prior to entering the chamber plasma region 1015. Accordingly, the fluorine-containing precursor as discussed above, for example, may pass through RPS 1002 or bypass the RPS unit in embodiments. Various other examples encompassed by this arrangement will be similarly understood.

A cooling plate 1003, faceplate 1017, ion suppressor 1023, showerhead 1025, and a substrate support 1065 (also known as a pedestal), having a substrate 1055 disposed thereon, are shown and may each be included according to embodiments. The pedestal 1065 may have a heat exchange channel through which a heat exchange fluid flows to control the temperature of the substrate. This configuration may allow the substrate 1055 temperature to be cooled or heated to maintain relatively low temperatures, such as between about −20° C. to about 200° C., or therebetween. The heat exchange fluid may comprise ethylene glycol and/or water. The wafer support platter of the pedestal 1065, which may comprise aluminum, ceramic, or a combination thereof, may also be resistively heated to relatively high temperatures, such as from up to or about 100° C. to above or about 1100° C., using an embedded resistive heater element. The heating element may be formed within the pedestal as one or more loops, and an outer portion of the heater element may run adjacent to a perimeter of the support platter, while an inner portion runs on the path of a concentric circle having a smaller radius. The wiring to the heater element may pass through the stem of the pedestal 1065, which may be further configured to rotate.

The faceplate 1017 may be pyramidal, conical, or of another similar structure with a narrow top portion expanding to a wide bottom portion. The faceplate 1017 may additionally be flat as shown and include a plurality of through-channels used to distribute process gases. Plasma generating gases and/or plasma excited species, depending on use of the RPS 1002, may pass through a plurality of holes, shown in FIG. 3B, in faceplate 1017 for a more uniform delivery into the chamber plasma region 1015.

Exemplary configurations may include having the gas inlet assembly 1005 open into a gas supply region 1058 partitioned from the chamber plasma region 1015 by faceplate 1017 so that the gases/species flow through the holes in the faceplate 1017 into the chamber plasma region 1015. Structural and operational features may be selected to prevent significant backflow of plasma from the chamber plasma region 1015 back into the supply region 1058, gas inlet assembly 1005, and fluid supply system 1010. The structural features may include the selection of dimensions and cross-sectional geometries of the apertures in faceplate 1017 to deactivate back-streaming plasma. The operational features may include maintaining a pressure difference between the gas supply region 1058 and chamber plasma region 1015 that maintains a unidirectional flow of plasma through the showerhead 1025. The faceplate 1017, or a conductive top portion of the chamber, and showerhead 1025 are shown with an insulating ring 1020 located between the features, which allows an AC potential to be applied to the faceplate 1017 relative to showerhead 1025 and/or ion suppressor 1023. The insulating ring 1020 may be positioned between the faceplate 1017 and the showerhead 1025 and/or ion suppressor 1023 enabling a capacitively coupled plasma (CCP) to be formed in the first plasma region. A baffle (not shown) may additionally be located in the chamber plasma region 1015, or otherwise coupled with gas inlet assembly 1005, to affect the flow of fluid into the region through gas inlet assembly 1005.

The ion suppressor 1023 may comprise a plate or other geometry that defines a plurality of apertures throughout the structure that are configured to suppress the migration of ionically-charged species out of chamber plasma region 1015 while allowing uncharged neutral or radical species to pass through the ion suppressor 1023 into an activated gas delivery region between the suppressor and the showerhead. In embodiments, the ion suppressor 1023 may comprise a perforated plate with a variety of aperture configurations. These uncharged species may include highly reactive species that are transported with less reactive carrier gas through the apertures. As noted above, the migration of ionic species through the holes may be reduced, and in some instances completely suppressed. Controlling the amount of ionic species passing through the ion suppressor 1023 may provide increased control over the gas mixture brought into contact with the underlying wafer substrate, which in turn may increase control of the deposition and/or etch characteristics of the gas mixture. For example, adjustments in the ion concentration of the gas mixture can significantly alter its etch selectivity, e.g., SiO:Si etch ratios, Si:SiO etch ratios, etc.

The plurality of holes in the ion suppressor 1023 may be configured to control the passage of the activated gas, i.e., the ionic, radical, and/or neutral species, through the ion suppressor 1023. For example, the aspect ratio of the holes, or the hole diameter to length, and/or the geometry of the holes may be controlled so that the flow of ionically-charged species in the activated gas passing through the ion suppressor 1023 is reduced. The holes in the ion suppressor 1023 may include a tapered portion that faces chamber plasma region 1015, and a cylindrical portion that faces the showerhead 1025. The cylindrical portion may be shaped and dimensioned to control the flow of ionic species passing to the showerhead 1025. An adjustable electrical bias may also be applied to the ion suppressor 1023 as an additional means to control the flow of ionic species through the suppressor.

The ion suppression element 1023 may function to reduce or eliminate the amount of ionically charged species traveling from the plasma generation region to the substrate. Uncharged neutral and radical species may still pass through the openings in the ion suppressor to react with the substrate.

Showerhead 1025 in combination with ion suppressor 1023 may allow a plasma present in chamber plasma region 1015 to avoid directly exciting gases in substrate processing region 1033, while still allowing excited species to travel from chamber plasma region 1015 into substrate processing region 1033. In this way, the chamber may be configured to prevent the plasma from contacting a substrate 1055 being etched. This may advantageously protect a variety of intricate structures and films patterned on the substrate, which may be damaged, dislocated, or otherwise warped if directly contacted by a generated plasma. Additionally, when plasma is allowed to contact the substrate or approach the substrate level, the rate at which silicon oxide or polysilicon etch may increase.

The processing system may further include a power supply 1040 electrically coupled with the processing chamber to provide electric power to the faceplate 1017, ion suppressor 1023, showerhead 1025, and/or pedestal 1065 to generate a plasma in the chamber plasma region 1015 or processing region 1033. The power supply may be configured to deliver an adjustable amount of power to the chamber depending on the process performed. Such a configuration may allow for a tunable plasma to be used in the processes being performed. Unlike a remote plasma unit, which is often presented with on or off functionality, a tunable plasma may be configured to deliver a specific amount of power to chamber plasma region 1015. This in turn may allow development of particular plasma characteristics such that precursors may be dissociated in specific ways to enhance the etching profiles produced by these precursors.

A plasma may be ignited either in chamber plasma region 1015 above showerhead 1025 or substrate processing region 1033 below showerhead 1025. A plasma may be present in chamber plasma region 1015 to produce the radical-fluorine precursors from an inflow of the fluorine-containing precursor. An AC voltage typically in the radio frequency (RF) range may be applied between the conductive top portion of the processing chamber, such as faceplate 1017, and showerhead 1025 and/or ion suppressor 1023 to ignite a plasma in chamber plasma region 1015 during deposition. An RF power supply may generate a high RF frequency of 13.56 MHz but may also generate other frequencies alone or in combination with the 13.56 MHz frequency.

Plasma power can be of a variety of frequencies or a combination of multiple frequencies. In the exemplary processing system the plasma may be provided by RF power delivered to faceplate 1017 relative to ion suppressor 1023 and/or showerhead 1025. The RF power may be between about 10 watts and about 5000 watts, between about 100 watts and about 2000 watts, between about 200 watts and about 1500 watts, or between about 200 watts and about 1000 watts in embodiments. The RF frequency applied in the exemplary processing system may be low RF frequencies less than about 200 kHz, high RF frequencies between about 10 MHz and about 15 MHz, or microwave frequencies greater than or about 1 GHz in embodiments. The plasma power may be capacitively-coupled (CCP) or inductively-coupled (ICP) into the remote plasma region.

Chamber plasma region 1015 (top plasma in figure) may be left at low or no power when a bottom plasma in the substrate processing region 1033 is turned on to, for example, cure a film or clean the interior surfaces bordering substrate processing region 1033. A plasma in substrate processing region 1033 may be ignited by applying an AC voltage between showerhead 1025 and the pedestal 1065 or bottom of the chamber. A treatment gas (such as argon) may be introduced into substrate processing region 1033 while the plasma is present to facilitate treatment of the patterned substrate. The showerhead 1025 may also be biased at a positive DC voltage relative to the pedestal 1065 or bottom of the chamber to accelerate positively charged ions toward patterned substrate 1055. In embodiments, the local plasma in substrate processing region 1033 may be struck by applying AC power via an inductively-coupled source while applying DC power by capacitively coupled means. As indicated previously, the local plasma power may be between about 10 watts and about 500 watts, between about 20 watts and about 400 watts, between about 30 watts and about 300 watts, or between about 50 watts and about 200 watts in embodiments.

A fluid, such as a precursor, for example a fluorine-containing precursor, may be flowed into the processing region 1033 by embodiments of the showerhead described herein. Excited species derived from the process gas in chamber plasma region 1015 may travel through apertures in the ion suppressor 1023, and/or showerhead 1025 and react with an additional precursor flowing into the processing region 1033 from a separate portion of the showerhead. Alternatively, if all precursor species are being excited in chamber plasma region 1015, no additional precursors may be flowed through the separate portion of the showerhead. Little or no plasma may be present in the processing region 1033 during the remote plasma etch process. Excited derivatives of the precursors may combine in the region above the substrate and/or on the substrate to etch structures or remove species from the substrate.

Exciting the fluids in the chamber plasma region 1015 directly, or exciting the fluids in the RPS units 1002, may provide several benefits. The concentration of the excited species derived from the fluids may be increased within the processing region 1033 due to the plasma in the chamber plasma region 1015. This increase may result from the location of the plasma in the chamber plasma region 1015. The processing region 1033 may be located closer to the chamber plasma region 1015 than the remote plasma system (RPS) 1002, leaving less time for the excited species to leave excited states through collisions with other gas molecules, walls of the chamber, and surfaces of the showerhead.

The uniformity of the concentration of the excited species derived from the process gas may also be increased within the processing region 1033. This may result from the shape of the chamber plasma region 1015, which may be more similar to the shape of the processing region 1033. Excited species created in the RPS 1002 may travel greater distances to pass through apertures near the edges of the showerhead 1025 relative to species that pass through apertures near the center of the showerhead 1025. The greater distance may result in a reduced excitation of the excited species and, for example, may result in a slower growth rate near the edge of a substrate. Exciting the fluids in the chamber plasma region 1015 may mitigate this variation for the fluid flowed through RPS 1002, or alternatively bypassed around the RPS unit.

The processing gases may be excited in chamber plasma region 1015 and may be passed through the showerhead 1025 to the processing region 1033 in the excited state. While a plasma may be generated in the processing region 1033, a plasma may alternatively not be generated in the processing region. In one example, the only excitation of the processing gas or precursors may be from exciting the processing gases in chamber plasma region 1015 to react with one another in the processing region 1033. As previously discussed, this may be to protect the structures patterned on the substrate 1055.

In addition to the fluid precursors, there may be other gases introduced at varied times for varied purposes, including carrier gases to aid delivery. A treatment gas may be introduced to remove unwanted species from the chamber walls, the substrate, the deposited film and/or the film during deposition. A treatment gas may be excited in a plasma and then used to reduce or remove residual content inside the chamber. In some embodiments the treatment gas may be used without a plasma. When the treatment gas includes water vapor, the delivery may be achieved using a mass flow meter (MFM), an injection valve, or by commercially available water vapor generators. The treatment gas may be introduced to the processing region 1033, either through the RPS unit or bypassing the RPS unit, and may further be excited in the first plasma region.

Figure 3B:
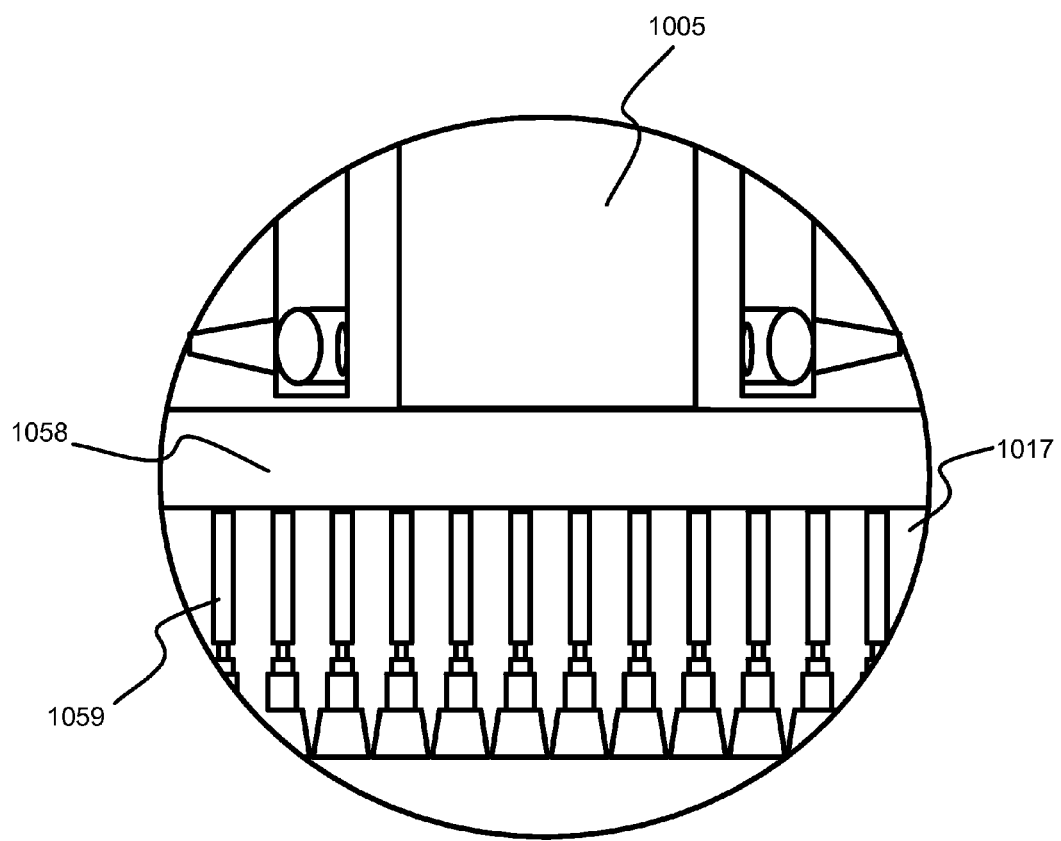
FIG. 3B shows a schematic cross-sectional view of a portion of a substrate processing chamber according to embodiments.

FIG. 3B shows a detailed view of the features affecting the processing gas distribution through faceplate 1017. As shown in FIG. 3A and FIG. 3B, faceplate 1017, cooling plate 1003, and gas inlet assembly 1005 intersect to define a gas supply region 1058 into which process gases may be delivered from gas inlet 1005. The gases may fill the gas supply region 1058 and flow to chamber plasma region 1015 through apertures 1059 in faceplate 1017. The apertures 1059 may be configured to direct flow in a substantially unidirectional manner such that process gases may flow into processing region 1033, but may be partially or fully prevented from backflow into the gas supply region 1058 after traversing the faceplate 1017.

Figure 3C:
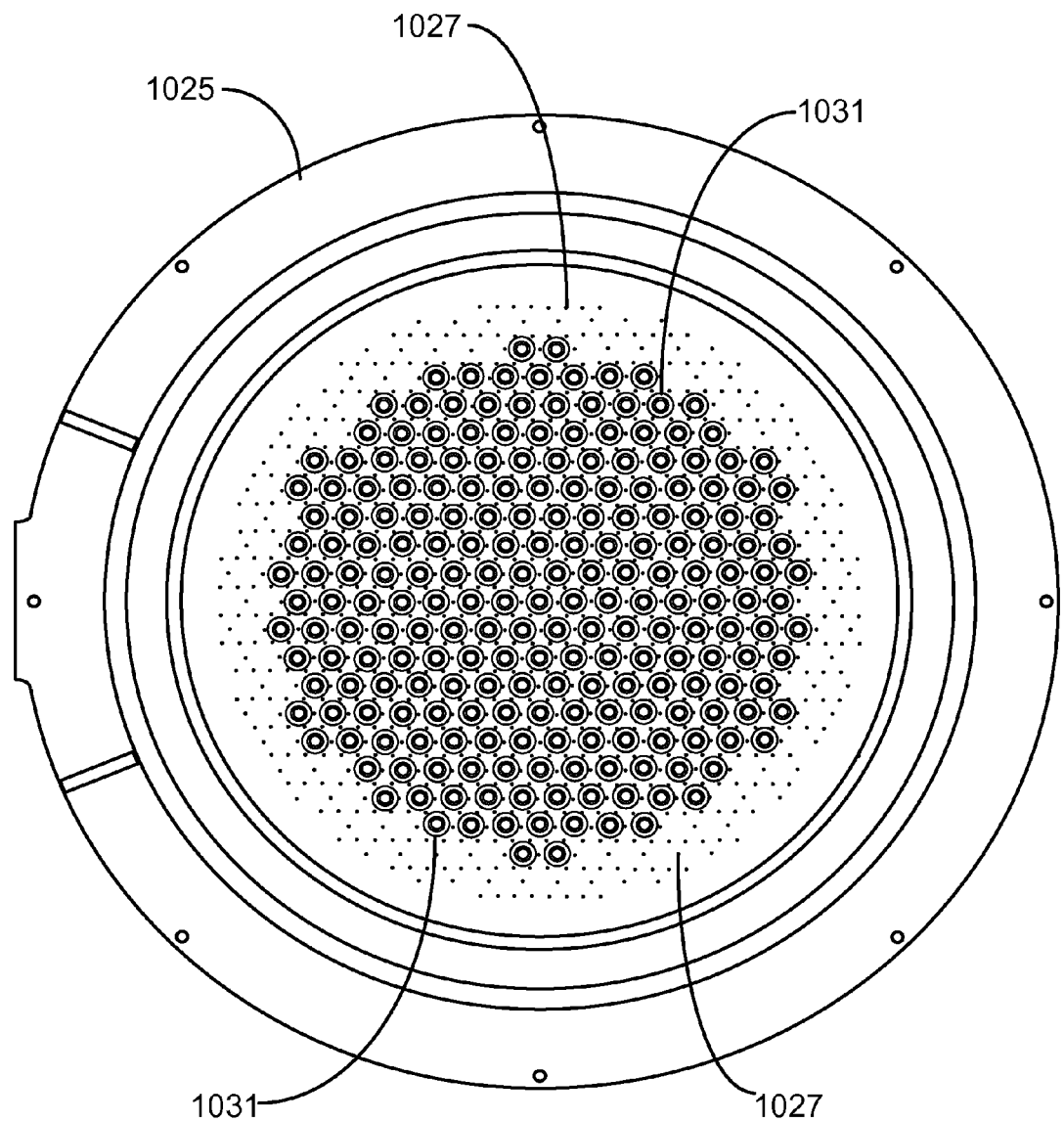
FIG. 3C shows a bottom plan view of a showerhead according to embodiments.

The gas distribution assemblies such as showerhead 1025 for use in the processing chamber section 1001 may be referred to as dual channel showerheads (DCSH) and are additionally detailed in the embodiments described in FIG. 3A as well as FIG. 3C herein. The dual channel showerhead may provide for etching processes that allow for separation of etchants outside of the processing region 1033 to provide limited interaction with chamber components and each other prior to being delivered into the processing region.

The showerhead 1025 may comprise an upper plate 1014 and a lower plate 1016. The plates may be coupled with one another to define a volume 1018 between the plates. The coupling of the plates may be so as to provide first fluid channels 1019 through the upper and lower plates, and second fluid channels 1021 through the lower plate 1016. The formed channels may be configured to provide fluid access from the volume 1018 through the lower plate 1016 via second fluid channels 1021 alone, and the first fluid channels 1019 may be fluidly isolated from the volume 1018 between the plates and the second fluid channels 1021. The volume 1018 may be fluidly accessible through a side of the gas distribution assembly 1025. Although the exemplary system of FIGS. 3A-3C includes a dual-channel showerhead, it is understood that alternative distribution assemblies may be utilized that maintain first and second precursors fluidly isolated prior to the processing region 1033. For example, a perforated plate and tubes underneath the plate may be utilized, although other configurations may operate with reduced efficiency or not provide as uniform processing as the dual-channel showerhead as described.

In the embodiment shown, showerhead 1025 may distribute via first fluid channels 1019 process gases which contain plasma effluents upon excitation by a plasma in chamber plasma region 1015. In embodiments, the process gas introduced into the RPS 1002 and/or chamber plasma region 1015 may contain fluorine, e.g., $CF_4$, $NF_3$ or $XeF_2$. The process gas may also include a carrier gas such as helium, argon, nitrogen ($N_2$), etc. Plasma effluents may include ionized or neutral derivatives of the process gas and may also be referred to herein as a radical-fluorine precursor referring to the atomic constituent of the process gas introduced.

FIG. 3C is a bottom view of a showerhead 1025 for use with a processing chamber in embodiments. Showerhead 1025 corresponds with the showerhead shown in FIG. 3A. Through-holes 1031, which show a view of first fluid channels 1019, may have a plurality of shapes and configurations to control and affect the flow of precursors through the showerhead 1025. Small holes 1027, which show a view of second fluid channels 1021, may be distributed substantially evenly over the surface of the showerhead, even amongst the through-holes 1031, which may help to provide more even mixing of the precursors as they exit the showerhead than other configurations.

The chamber plasma region 1015 or a region in an RPS may be referred to as a remote plasma region. In embodiments, the radical precursor, e.g., a radical-fluorine precursor, is created in the remote plasma region and travels into the substrate processing region where it may or may not combine with additional precursors. In embodiments, the additional precursors are excited only by the radical-fluorine precursor. Plasma power may essentially be applied only to the remote plasma region in embodiments to ensure that the radical-fluorine precursor provides the dominant excitation. Nitrogen trifluoride or another fluorine-containing precursor may be flowed into chamber plasma region 1015 at rates between about 5 sccm and about 500 sccm, between about 10 sccm and about 150 sccm, or between about 25 sccm and about 125 sccm in embodiments.

Combined flow rates of precursors into the chamber may account for 0.05% to about 20% by volume of the overall gas mixture; the remainder being carrier gases. The fluorine-containing precursor may be flowed into the remote plasma region, but the plasma effluents may have the same volumetric flow ratio in embodiments. In the case of the fluorine-containing precursor, a purge or carrier gas may be first initiated into the remote plasma region before the fluorine-containing gas to stabilize the pressure within the remote plasma region. Substrate processing region 1033 can be maintained at a variety of pressures during the flow of precursors, any carrier gases, and plasma effluents into substrate processing region 1033. The pressure may be maintained between about 0.1 mTorr and about 100 Torr, between about 1 Torr and about 20 Torr or between about 1 Torr and about 5 Torr in embodiments.

Figure 4:
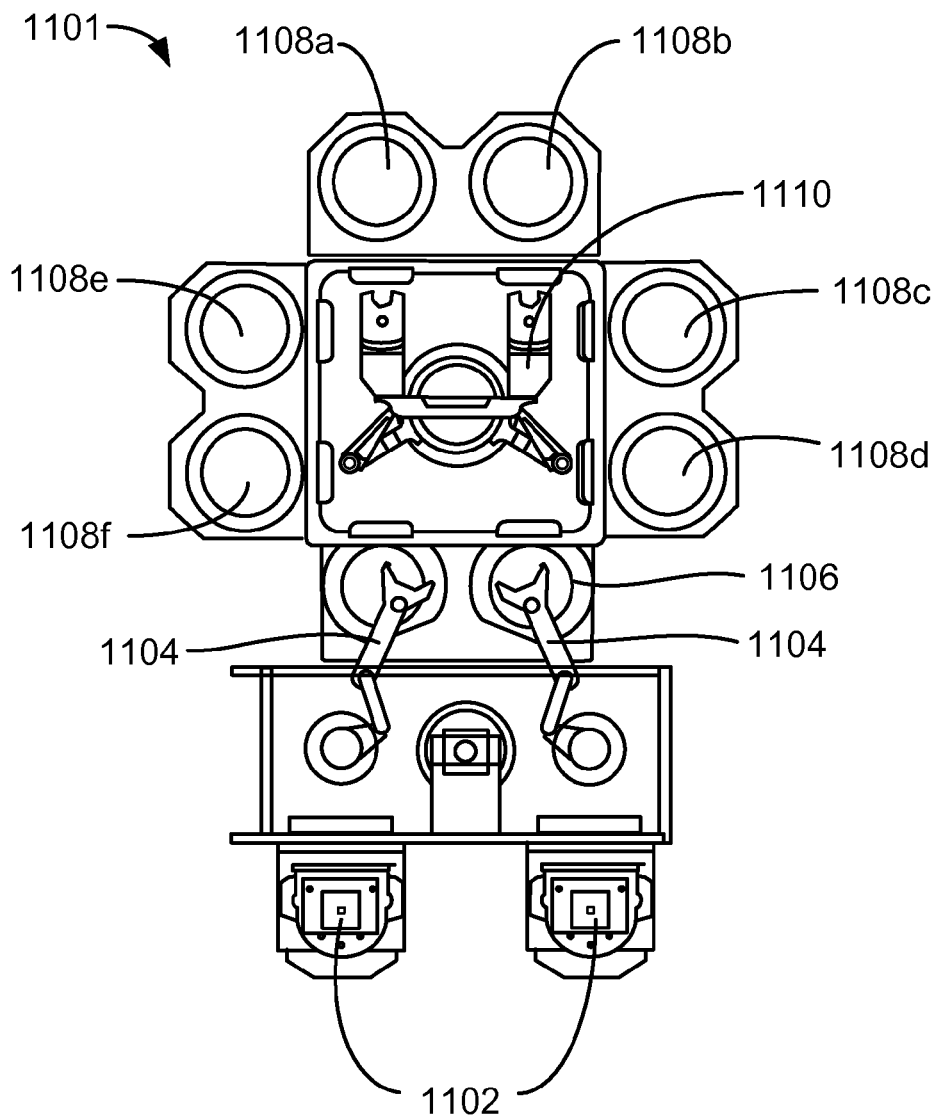
FIG. 4 shows a top plan view of an exemplary substrate processing system according to embodiments.

Embodiments of the deposition systems may be incorporated into larger fabrication systems for producing integrated circuit chips. FIG. 4 shows one such processing system (mainframe) 1101 of deposition, etching, baking, and curing chambers in embodiments. In the figure, a pair of front opening unified pods (load lock chambers 1102) supply substrates of a variety of sizes that are received by robotic arms 1104 and placed into a low pressure holding area 1106 before being placed into one of the substrate processing chambers 1108*a-f*. A second robotic arm 1110 may be used to transport the substrate wafers from the holding area 1106 to the substrate processing chambers 1108*a-f* and back. Each substrate processing chamber 1108*a-f*, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation, and other substrate processes.

The substrate processing chambers 1108*a-f* may be configured for depositing, annealing, curing and/or etching a film on the substrate wafer. In one configuration, all three pairs of chambers, e.g., 1108*a-f*, may be configured to etch a film on the substrate, for example, chambers 1108*a-b* may be configured to etch the silicon oxide layers while chambers 1108*c-f* may be configured to etch the silicon nitride layer.

In the preceding description, for the purposes of explanation, numerous details have been set forth to provide an understanding of various embodiments of the present invention. It will be apparent to one skilled in the art, however, that certain embodiments may be practiced without some of these details, or with additional details.

As used herein "substrate" may be a support substrate with or without layers formed thereon. The patterned substrate may be an insulator or a semiconductor of a variety of doping concentrations and profiles and may, for example, be a semiconductor substrate of the type used in the manufacture of integrated circuits. Exposed "silicon" or "polysilicon" of the patterned substrate is predominantly Si but may include minority concentrations of other elemental constituents such as nitrogen, oxygen, hydrogen and carbon. Exposed "silicon" or "polysilicon" may consist of or consist essentially of silicon. Exposed "silicon nitride" of the patterned substrate is predominantly $Si_3N_4$ but may include minority concentrations of other elemental constituents such as oxygen, hydrogen and carbon. "Exposed silicon nitride" may consist essentially of or consist of silicon and nitrogen. Exposed "silicon oxide" of the patterned substrate is predominantly $SiO_2$ but may include minority concentrations of other elemental constituents such as nitrogen, hydrogen and carbon. In embodiments, silicon oxide films etched using the methods taught herein consist essentially of or consist of silicon and oxygen.

The term "precursor" is used to refer to any process gas which takes part in a reaction to either remove material from or deposit material onto a surface. "Plasma effluents" describe gas exiting from the chamber plasma region and entering the substrate processing region. Plasma effluents are in an "excited state" wherein at least some of the gas molecules are in vibrationally-excited, dissociated and/or ionized states. A "radical precursor" is used to describe plasma effluents (a gas in an excited state which is exiting a plasma) which participate in a reaction to either remove material from or deposit material on a surface. "Radical-fluorine" are radical precursors which contain fluorine but may contain other elemental constituents. The phrase "inert gas" refers to any gas which does not form chemical bonds when etching or being incorporated into a film. Exemplary inert gases include noble gases but may include other gases so long as no chemical bonds are formed when (typically) trace amounts are trapped in a film.

The terms "gap" and "trench" are used throughout with no implication that the etched geometry has a large horizontal aspect ratio. Viewed from above the surface, trenches may appear circular, oval, polygonal, rectangular, or a variety of other shapes. A trench may be in the shape of a moat around an island of material. The term "via" is used to refer to a low aspect ratio trench (as viewed from above) which may or may not be filled with metal to form a vertical electrical connection. As used herein, an isotropic or a conformal etch process refers to a generally uniform removal of material on a surface in the same shape as the surface, i.e., the surface of the etched layer and the pre-etch surface are generally parallel. A person having ordinary skill in the art will recognize that the etched interface likely cannot be 100% conformal and thus the term "generally" allows for acceptable tolerances.

Having disclosed several embodiments, it will be recognized by those of skill in the art that various modifications, alternative constructions, and equivalents may be used without departing from the spirit of the disclosed embodiments. Additionally, a number of well-known processes and elements have not been described to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

The invention claimed is:

1. A method of forming a 3-d flash memory cell, the method comprising:

transferring a patterned substrate into a substrate processing mainframe, wherein the patterned substrate comprises a vertical stack of alternating silicon oxide and silicon nitride slabs surrounding a vertical memory hole and a conformal ONO layer overlying the vertical stack, wherein the conformal ONO layer comprises a first silicon oxide layer, a silicon nitride layer and a second silicon oxide layer;

transferring the patterned substrate into a first substrate processing chamber mounted on the substrate processing mainframe;

flowing a first fluorine-containing precursor into a first remote plasma region within the first substrate processing chamber while striking a plasma to form first plasma effluents from the fluorine-containing precursor;

flowing the first plasma effluents into a first substrate processing region within the first substrate processing chamber; wherein the first substrate processing region houses the patterned substrate;

reacting the first plasma effluents with the conformal ONO layer to etch back the first silicon oxide layer and the second silicon oxide layer within the vertical memory hole;

transferring the patterned substrate without breaking vacuum from the first substrate processing chamber to a second substrate processing chamber mounted on the substrate processing mainframe;

flowing a second fluorine-containing precursor and an oxygen-containing precursor into a second remote plasma region within the second substrate processing chamber while striking a plasma to form second plasma effluents and flowing the second plasma effluents through a showerhead into a second substrate processing region housing the patterned substrate within the second substrate processing chamber;

reacting the second plasma effluents with the conformal ONO layer to etch back the silicon nitride layer; and removing the patterned substrate from the substrate processing mainframe.

2. The method of claim 1, wherein the first plasma effluents are combined with an unexcited precursor not passed through any plasma prior to entering the first substrate processing region.

3. The method of claim 2, wherein the unexcited precursor comprises water, an alcohol, or NxHy where x and y are greater than or equal to one.

4. The method of claim 1, wherein the oxygen-containing precursor is one of atomic oxygen, molecular oxygen, ozone, nitrogen dioxide or nitrous oxide.

5. The method of claim 1, wherein the vertical memory hole is circular as viewed from above.

6. The method of claim 1, wherein reacting the first plasma effluents comprises removing a horizontal portion of the first silicon oxide layer and the second silicon oxide layer within the vertical memory hole.

7. The method of claim 6, wherein reacting the first plasma effluents comprises completely removing the horizontal portions of the first silicon oxide layer and the second silicon oxide layer within the vertical memory hole.

8. The method of claim 1, wherein reacting the second plasma effluents comprises removing a horizontal portion of the silicon nitride layer within the vertical memory hole.

9. The method of claim 8, wherein reacting the second plasma effluents comprises completely removing the horizontal portions of the silicon nitride layer within the vertical memory hole.

10. A method of forming a 3-d flash memory cell, the method comprising:

transferring a patterned substrate into a substrate processing mainframe, wherein the patterned substrate comprises a vertical stack of alternating silicon oxide and silicon nitride slabs and a conformal ONO layer overlying the vertical stack, wherein the conformal ONO layer comprises a first silicon oxide layer, a silicon nitride layer and a second silicon oxide layer;

transferring the patterned substrate into a first substrate processing chamber mounted on the substrate processing mainframe;

flowing a first fluorine-containing precursor into a first remote plasma region within the first substrate processing chamber while striking a plasma to form first plasma effluents from the fluorine-containing precursor;

flowing the first plasma effluents into a first substrate processing region within the first substrate processing chamber; wherein the first substrate processing region houses the patterned substrate;

reacting the first plasma effluents with the conformal ONO layer;

transferring the patterned substrate without breaking vacuum from the first substrate processing chamber to a second substrate processing chamber mounted on the substrate processing mainframe;

flowing a second fluorine-containing precursor into a second remote plasma region within the second substrate processing chamber while striking a plasma to form second plasma effluents and flowing the second plasma effluents through a showerhead into a second substrate processing region housing the patterned substrate within the second substrate processing chamber;

reacting the second plasma effluents with the conformal ONO layer; and removing the patterned substrate from the substrate processing mainframe, wherein the patterned substrate is not exposed to atmosphere between transferring the patterned substrate into the substrate processing mainframe and removing the patterned substrate from the substrate processing mainframe.

11. The method of claim 10, wherein the first silicon oxide layer and the second silicon oxide layer are etched back in the first substrate processing region and the silicon nitride layer is etched back afterwards in the second substrate processing region.

12. The method of claim 10, wherein the first silicon oxide layer and the second silicon oxide layer are etched back in the second substrate processing region and the silicon nitride layer is etched back earlier in the process in the first substrate processing region.

13. The method of claim 10, wherein the first fluorine-containing precursor is nitrogen trifluoride and the second fluorine-containing precursor is nitrogen trifluoride.

14. The method of claim 10, wherein flowing the first fluorine-containing precursor into the first remote plasma region further comprises flowing a hydrogen-containing precursor into the first remote plasma region.

15. The method of claim 10, wherein an electron temperature in the first substrate processing region during reacting the first plasma effluents and in the second substrate processing region during reacting the second plasma effluents are each below 0.5 eV.

* * * * *